(12) United States Patent
Hurwitz et al.

(10) Patent No.: US 10,779,417 B2
(45) Date of Patent: Sep. 15, 2020

(54) SUBSTRATES WITH ULTRA FINE PITCH FLIP CHIP BUMPS

(71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuhai ACCESS Semiconductor Co., Ltd., Zhuhai (CN)

( * ) Notice: Subject to any disclaimer, the term of this patent is extended or adjusted under 35 U.S.C. 154(b) by 479 days.

(21) Appl. No.: 15/622,733

(22) Filed: Jun. 14, 2017

(65) Prior Publication Data

US 2017/0374747 A1 Dec. 28, 2017

Related U.S. Application Data

(62) Division of application No. 14/150,683, filed on Jan. 8, 2014, now abandoned.

(51) Int. Cl.
*H05K 3/40* (2006.01)
*H01L 23/00* (2006.01)
(Continued)

(52) U.S. Cl.
CPC .......... *H05K 3/4007* (2013.01); *H01L 24/17* (2013.01); *H01L 24/13* (2013.01); *H01L 24/16* (2013.01); *H01L 24/81* (2013.01); *H01L 2224/13111* (2013.01); *H01L 2224/16225* (2013.01); *H01L 2224/81192* (2013.01); *H01L 2224/81805* (2013.01); *H01L 2924/00011* (2013.01); *H01L 2924/01322* (2013.01); *H05K 1/112* (2013.01); *H05K 3/0041* (2013.01);

*H05K 3/108* (2013.01); *H05K 3/26* (2013.01); *H05K 3/3473* (2013.01); *H05K 3/4647* (2013.01); *H05K 2201/09436* (2013.01); *H05K 2201/10674* (2013.01); *H05K 2203/025* (2013.01);
(Continued)

(58) Field of Classification Search
CPC ........ H05K 3/0041; H05K 3/108; H05K 3/26; H05K 3/3473; H05K 3/4007; H05K 3/4647; H05K 1/112; H01L 24/17
See application file for complete search history.

(56) References Cited

U.S. PATENT DOCUMENTS 5,162,257 A 11/1992 Yung
5,293,006 A 3/1994 Yung
(Continued)

FOREIGN PATENT DOCUMENTS

| EP | 1286579 A1 * | 2/2003 | ........... H05K 1/0271 |
|---|---|---|---|
| JP | 2004-186629 A | 7/2004 | |
| KR | 10-2010-0003492 A | 1/2010 | |

*Primary Examiner* — Peter Dungba Vo
*Assistant Examiner* — Jeffrey T Carley
(74) *Attorney, Agent, or Firm* — Wiggin and Dana LLP; Gregory S. Rosenblatt; Thomas M. Landman

(57) ABSTRACT

A method of attaching a chip to the substrate with an outer layer comprising via pillars embedded in a dielectric such as solder mask, with ends of the via pillars flush with said dielectric, the method comprising the steps of: (o) optionally removing organic varnish, (p) positioning a chip having legs terminated with solder bumps in contact with exposed ends of the via pillars, and (q) applying heat to melt the solder bumps and to wet the ends of the vias with solder.

8 Claims, 19 Drawing Sheets

(51) Int. Cl.
  *H05K 1/11* (2006.01)
  *H05K 3/00* (2006.01)
  *H05K 3/10* (2006.01)
  *H05K 3/26* (2006.01)
  *H05K 3/34* (2006.01)
  *H05K 3/46* (2006.01)
(52) U.S. Cl.
  CPC ........... *H05K 2203/0278* (2013.01); *H05K 2203/043* (2013.01); *H05K 2203/0465* (2013.01)

(56) References Cited

U.S. PATENT DOCUMENTS

| | | | |
|---|---|---|---|
| 6,117,299 | A | 9/2000 | Rinne et al. |
| 6,506,982 | B1 | 1/2003 | Shigi et al. |
| 6,592,019 | B2 * | 7/2003 | Tung ............... H01L 24/11 228/197 |
| 7,614,145 | B2 | 11/2009 | Wakizaka et al. |
| 7,635,641 | B2 | 12/2009 | Hurwitz et al. |
| 7,669,320 | B2 | 3/2010 | Hurwitz et al. |
| 7,682,972 | B2 | 3/2010 | Hurwitz et al. |
| 8,249,849 | B2 * | 8/2012 | Amano ............ G06F 30/367 703/14 |
| 8,530,344 | B1 * | 9/2013 | Shih ............... H01L 23/58 438/612 |
| 2001/0040290 | A1 * | 11/2001 | Sakurai ........... H01L 23/3128 257/737 |
| 2003/0148558 | A1 * | 8/2003 | Kubo ............... H01L 21/76838 438/128 |
| 2004/0180540 | A1 * | 9/2004 | Yamasaki ........ H01L 21/4857 438/667 |
| 2006/0180341 | A1 | 8/2006 | Kariya et al. |
| 2008/0093111 | A1 | 4/2008 | Tsurumi |
| 2008/0138576 | A1 * | 6/2008 | Nozu ............... B32B 18/00 428/138 |
| 2008/0179740 | A1 | 7/2008 | Liao |
| 2009/0314533 | A1 | 12/2009 | Watanabe et al. |
| 2010/0263923 | A1 | 10/2010 | Kodani et al. |
| 2011/0042128 | A1 | 2/2011 | Hsu |
| 2011/0299259 | A1 | 12/2011 | Hsieh et al. |
| 2012/0217624 | A1 | 8/2012 | Morris et al. |
| 2012/0222894 | A1 | 9/2012 | Kaneko et al. |
| 2013/0056251 | A1 | 3/2013 | Miyairi et al. |
| 2013/0098670 | A1 * | 4/2013 | Inoue .............. H05K 3/4007 174/264 |
| 2013/0319737 | A1 * | 12/2013 | Hurwitz .......... H01L 23/3677 174/257 |
| 2014/0102765 | A1 * | 4/2014 | Hurwitz .......... H05K 3/4647 174/251 |
| 2015/0069603 | A1 * | 3/2015 | Foong ............. H01L 23/49811 257/738 |
| 2015/0279881 | A1 * | 10/2015 | Shizukuishi ...... H01L 27/1464 438/67 |

* cited by examiner

SUBSTRATES WITH ULTRA FINE PITCH FLIP CHIP BUMPS

CROSS-REFERENCE TO RELATED PATENT APPLICATION

This patent application is a division of U.S. patent application Ser. No. 14/150,683 by Hurwitz, titled "Substrates with Ultra Fine Pitch Flip Chip Bumps," that was filed on Jan. 8, 2014. The disclosure of U.S. Ser. No. 14/150,683 is incorporated by reference herein in its entirety.

BACKGROUND

Field of the Disclosure

The present invention is directed to terminating interconnect structures and to coupling between chips and substrates.

Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Of the various approaches for achieving these requirements, one widely implemented manufacturing technique that creates interconnecting vias between layers uses lasers to drill holes through the subsequently laid down dielectric substrate through to the latest metal layer for subsequent filling with a metal, usually copper, that is deposited therein by a plating technique. This approach to creating vias is sometimes referred to as 'drill & fill', and the vias created thereby may be referred to as 'drilled & filled vias'.

There are a number of disadvantages with the drilled & filled via approach. Since each via is required to be separately drilled, the throughput rate is limited, and the costs of fabricating sophisticated, multi-via IC substrates and interposers becomes prohibitive. In large arrays it is difficult to produce a high density of high quality vias having different sizes and shapes in close proximity to each other by the drill & fill methodology. Furthermore, laser drilled vias have rough side walls and taper inwards through the thickness of the dielectric material. This tapering reduces the effective diameter of the via. It may also adversely affect the electrical contact to the previous conductive metal layer especially at ultra small via diameters, thereby causing reliability issues. Additionally, the side walls are particularly rough where the dielectric being drilled is a composite material comprising glass or ceramic fibers in a polymer matrix, and this roughness may result in stray inductances.

The filling process of the drilled via holes is usually achieved by copper electroplating. Electroplating into a drilled hole may result in dimpling, where a small crater appears at the end of the via. Alternatively, overfill may result, where a via channel is filled with more copper than it can hold, and a domed upper surface that protrudes over the surrounding material is created. Both dimpling and overfill tend to create difficulties when subsequently stacking vias one on end of the other, as required when fabricating high-density substrates and interposers. Furthermore, it will be appreciated that large via channels are difficult to fill uniformly, especially when they are in proximity to smaller vias within the same interconnecting layer of the interposer or IC substrate design.

The range of acceptable sizes and reliability is improving over time. Nevertheless, the disadvantages described hereinabove are intrinsic to the drill & fill technology and are expected to limit the range of possible via sizes. It will further be noted that laser drilling is best for creating round via channels. Although slot shaped via channels may theoretically be fabricated by laser milling, in practice, the range of geometries that may be fabricated is somewhat limited and vias in a given support structure are typically cylindrical and substantially identical.

Fabrication of vias by drill & fill is expensive and it is difficult to evenly and consistently fill the via channels created thereby with copper using the relatively, cost-effective electroplating process.

Laser drilled vias in composite dielectric materials are practically limited to a minimum diameter of $60 \times 10^{-6}$ m, and even so suffer from significant tapering shape as well as rough side walls due to the nature of the composite material drilled, in consequence of the ablation process involved.

In addition to the other limitations of laser drilling as described hereinabove, there is a further limitation of the drill & fill technology in that it is difficult to create different diameter vias in the same layer, since when drill different sized via channels are drilled and then filled with metal to fabricate different sized vias, the via channels fill up at different rates. Consequently, the typical problems of dimpling or overfill that characterize drill & fill technology are exasperated, since it is impossible to simultaneously optimize deposition techniques for different sized vias.

An alternative solution that overcomes many of the disadvantages of the drill & fill approach, is to fabricate vias by depositing copper or other metal into a pattern created in a photo-resist, using a technology otherwise known as 'pattern plating'.

In pattern plating, a seed layer is first deposited. Then a layer of photo-resist is deposited thereover and subsequently exposed to create a pattern, and selectively removed to make trenches that expose the seed layer. Via posts are created by depositing Copper into the photo-resist trenches. The remaining photo-resist is then removed, the seed layer is etched away, and a dielectric material that is typically a polymer impregnated glass fiber mat, is laminated thereover and therearound to encase the via posts. Various techniques and processes can then be used to planarize the dielectric material, removing part of it to expose the ends of the via posts to allow conductive connection to ground thereby, for building up the next metal layer thereupon. Subsequent layers of metal conductors and via posts may be deposited there onto by repeating the process to build up a desired multilayer structure.

In an alternative but closely linked technology, known hereinafter as 'panel plating', a continuous layer of metal or alloy is deposited onto a substrate. A layer of photo-resist is deposited on end of the substrate, and a pattern is developed therein. The pattern of developed photo-resist is stripped away, selectively exposing the metal thereunder, which may then be etched away. The undeveloped photo-resist protects the underlying metal from being etched away, and leaves a pattern of upstanding features and vias.

After stripping away the undeveloped photo-resist, a dielectric material, such as a polymer impregnated glass fiber mat, may be laminated around and over the upstanding copper features and/or via posts. After planarizing, subsequent layers of metal conductors and via posts may be deposited there onto by repeating the process to build up a desired multilayer structure.

The via layers created by pattern plating or panel plating methodologies described above are typically known as 'via posts' and feature layers from copper.

It will be appreciated that the general thrust of the microelectronic evolution is directed towards fabricating ever smaller, thinner, lighter and more powerful products having high reliability. The use of thick, cored interconnects, prevents ultra-thin products being attainable. To create ever higher densities of structures in the interconnect IC substrate or 'interposer', ever more layers of ever smaller connections are required. Indeed, sometimes it is desirable to stack components on end of each other.

If plated, laminated structures are deposited on a copper or other appropriate sacrificial substrate, the substrate may be etched away leaving free standing, coreless laminar structures. Further layers may be deposited on the side previously adhered to the sacrificial substrate, thereby enabling a two sided build up, which minimizes warping and aids the attaining of planarity.

One flexible technology for fabricating high density interconnects is to build up pattern or panel plated multilayer structures consisting of metal vias or via post features having various geometrical shapes and forms in a dielectric matrix. The metal may be copper and the dielectric may be a fiber reinforced polymer, typically a polymer with a high glass transition temperature ($T_g$) is used, such as polyimide, for example. These interconnects may be cored or coreless, and may include cavities for stacking components. They may have odd or even numbers of layers and the via may have non circular shapes. Enabling technology is described in previous patents issued to Amitec-Advanced Multilayer Interconnect Technologies Ltd.

For example, U.S. Pat. No. 7,682,972 to Hurwitz et al. titled "Advanced multilayer coreless support structures and method for their fabrication" describes a method of fabricating a free standing membrane including a via array in a dielectric, for use as a precursor in the construction of superior electronic support structures, includes the steps of fabricating a membrane of conductive vias in a dielectric surround on a sacrificial carrier, and detaching the membrane from the sacrificial carrier to form a free standing laminated array. An electronic substrate based on such a free standing membrane may be formed by thinning and planarizing the laminated array, followed by terminating the vias. This publication is incorporated herein by reference in its entirety.

U.S. Pat. No. 7,669,320 to Hurwitz et al. titled "Coreless cavity substrates for chip packaging and their fabrication" describes a method for fabricating an IC support for supporting a first IC die connected in series with a second IC die; the IC support comprising a stack of alternating layers of copper features and vias in insulating surround, the first IC die being bondable onto the IC support, and the second IC die being bondable within a cavity inside the IC support, wherein the cavity is formed by etching away a copper base and selectively etching away built up copper. This publication is incorporated herein by reference in its entirety.

U.S. Pat. No. 7,635,641 to Hurwitz et al. titled "integrated circuit support structures and their fabrication" describes a method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (E) applying a protective coating of photo-resist to the second base layer; (F) etching away the first base layer; (G) removing the protective coating of photo-resist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second half stack of alternating conductive layers and insulating layers, (K) removing the second base layer, and (L) terminating the substrate by exposing ends of vias on outer surfaces of the stack and applying terminations thereto. This publication is incorporated herein by reference in its entirety.

The via post technology described in U.S. Pat. Nos. 7,682,972, 7,669,320 and 7,635,641 lends itself to mass production, with very large numbers of vias being simultaneously electroplated. As mentioned above, current drill & fill vias have an effective minimal diameter of about 60 microns. In contradistinction, via post technology using photo resist and electroplating, enables higher densities of vias to be obtained. Via diameters of as little as 30 micron diameter are possible and various via geometries and shapes could be cofabricated within the same layer.

Over time, it is anticipated that both drill & fill technologies and via post deposition will enable fabrication of substrates with further miniaturization and higher densities of vias and features. Nevertheless, it would appear likely that developments in via post technology will maintain a competitive edge.

Substrates enable chips to interface with other components. Chips have to be bonded to substrates in a manner that provides reliable electronic connections to enable electronic communication between chips and substrates.

Among the high density leading technologies used to interconnect the Substrate to Chips is the well established "Flip Chip technology" in which solder bumps, lead free solder bumps, or copper bumps having solder or lead free solder on their tips, are grown on the Chip terminating pads and the Chip is then flipped over to interconnect its bumps on the top surface pads of the Substrate. As Chip bumps and pitches become denser, advanced Substrates are usually equipped with bumps of their own to assist with the interconnection to the chip bumps. Such bumps on the substrate pads are also known as "SoP" (Solder on Pad") bumps—and usually consist of solder or lead free solder. They are generally applied to the substrate terminating pads by stencil printing followed by reflow, or by electroplating processes followed by reflow. Such bumps are usually "coined" by using heat and pressure to generate a top flat surface that can assist with the placement of the bumps from the die side.

When the Chip bumps come in contact with the SoP bumps through reflow, the solder material of the SoP bumps helps to generate a reliable mechanical and electronic contact with the Chip bump. Without the SoP, the solder material of the chip bumps may not be sufficient or may not be able to completely flow and wet the entire surface of the substrate's terminating pad thereby creating a reliability hazard or even a disconnect between the chip and the substrate. This is an especially a valid concern since most of the substrates have a solder mask external protective layer that by nature extends above the terminating substrate pads thereby making these pads difficult to access without the SoP bumps.

It will be appreciated that the size and pitch of Chip bumps must be aligned as much possible to those of the SoP bumps. With ongoing developments in chip technology, chips become ever denser, and connection bumps will have to become ever smaller and more densely packed as ever higher concentrations of contacts are required. Consequently, the application of SoP bumps on the substrate becomes ever more challenging. The application of SoP is, by nature, a lower yield process than earlier substrate manufacturing steps, and it is one of the final processing steps in the substrate fabrication, thereby increasing scrap, rework, test and cost rates. Additionally, the more fine the pitch of subsequent generations of SoP bumps, the greater will be the likelihood of failure by shorting between adjacent bumps after reflow and during chip assembly, thereby further reducing yields and increasing the total package cost.

As post sizes shrink, it becomes ever more difficult to keep individual wires electronically isolated from each other to prevent shorting. Soldering is also tricky, in that too little solder may result in some connections being broken. However, too much solder risks shorting between nearby connections.

Electroplating of solder bumps is known. For example, see U.S. Pat. Nos. 5,162,257 and 5,293,006 to Yung and U.S. Pat. No. 6,117,299 to Rinne.

As the density of solder bumps increases and their size decreases due to the ongoing drive towards ever greater miniaturization and increased complexity, it becomes more and more difficult to prevent shorting when the solder is melted during reflow.

A particular problem of fabricating solder bumps on substrates is aligning them correctly with underlying copper vias, as required to provide good electronic and mechanical coupling.

Embodiments of the present invention address these issues.

BRIEF SUMMARY

There is a need to provide SoP bumps on multilayer electronic support structures that are aligned with the copper vias of the multilayer electronic support structures.

A first aspect of the invention is directed to providing a multilayer composite electronic structure comprising feature layers extending in an X-Y plane, each adjacent pair of feature layers being separated by an inner via layer, the via layer comprising via posts that couple adjacent feature layers in a Z direction perpendicular to the X-Y plane, the via posts being embedded in an inner layer dielectric, the multilayer composite structure further comprising at least one outer layer of terminations comprising at least one micro bump wherein the at least one micro bump comprises a via pillar capped with a solderable material.

Typically the at least one outer layer of terminations comprises a two dimensional array of microbumps.

Optionally, the thickness of the micro bump is between 15 micron and 50 micron.

Optionally, the solderable material is selected from the group consisting of lead, tin, lead-tin alloys, tin-silver alloys, tin silver copper alloys, tin copper alloys and tin copper nickel alloys.

Typically, the solderable material is tin based.

Preferably, the solderable material is lead free.

Preferably, the diameter of the at least one micro bump is in a range compatible with chip bumps.

Typically, the diameter of the at least one micro bump is in a range of 60 to 110 microns.

Optionally, the diameter of the at least one micro bump is a minimum of 25 micron.

Optionally, the separation of adjacent micro bumps is a minimum of 15 micron.

Optionally, the pitch of the micro bumps is 40 microns.

Optionally, the outer dielectric has a smoothness of less than 100 nm.

Optionally, the outer dielectric has a smoothness of less than 50 nm.

Optionally, the outer dielectric is selected from the group consisting of NX04H (Sekisui), HBI-800TR67680 (Taiyo) and GX-13 (Afinomoto).

A second aspect is directed to a method of terminating a side of a multilayer composite structure having an outer layer of via posts embedded in a dielectric, comprising the steps of:
(i) thinning away the outer layer to expose the copper vias;
(ii) sputtering a layer of copper over the thinned surface;
(iii) applying, exposing and developing a penultimate pattern of photoresist;
(iv) electroplating an external feature layer into the pattern;
(v) stripping away the penultimate pattern of photoresist;
(vi) applying, exposing and developing an ultimate pattern of photoresist corresponding to the desired pattern of micro bumps;
(vii) pattern plating copper via posts into the ultimate pattern of photoresist;
(viii) pattern plating solderable metal over the copper via posts;
(ix) stripping away the ultimate pattern of photoresist;
(x) etching away the seed layer;
(xi) laminating a dielectric outer layer;
(xiv) plasma etching the dielectric outer layer to expose the solderable cap of the via post, and
(xv) applying a finishing treatment to the solderable cap of the via post.

Optionally, the dielectric outer layer is selected from the group consisting of a film dielectric and a dry film solder mask.

Optionally, step (xv) of applying a finishing treatment to the solderable cap comprises coining by applying pressure to the solder cap along axis of the via post resulting in a flat coined solderable cap.

Optionally, step (xv) of applying a finishing treatment to the solderable cap comprises coining by applying pressure along axis of the via post together with heat to cause reflow under pressure, resulting in a flat coined solderable cap.

Optionally, step (xv) of applying a finishing treatment to the solderable cap comprises applying heat to cause reflow without applying pressure such that the solderable cap assumes a dome shape to surface pressure.

Optionally, the method further comprises step (xii) of planarizing the dielectric outer layer.

Optionally, the planarizing comprises Chemical Mechanical Polishing.

Optionally the step of plasma etching comprises exposing to ion bombardment in a low pressure atmosphere comprising ionizing at least one of the gases selected from the group consisting of oxygen, tetrafluoride carbon and fluorine.

Optionally, the method further comprises applying terminations on other side of the substrate.

In one embodiment, applying terminations comprises:
(a) thinning the other side to expose the ends of copper vias;
(b) sputtering a copper seed layer;
(c) applying, exposing and developing a layer of photoresist;
(d) electroplating copper pads into the photoresist;
(e) removing the photoresist, and
(f) depositing solder mask over substrate between and overlapping the copper pads.

A third aspect is directed to a method of applying solderable bumps to ends of via posts comprising electroplating the via posts into a patterned photoresist; plating a solderable material over the via posts; removing the photoresist to expose the via posts and solderable material, applying a dielectric layer, and plasma etching the dielectric layer to leave the solderable caps upstanding.

Typically the method further comprises applying a finishing treatment to the solderable caps.

Optionally, the compacting comprises at least one of (i) applying pressure along axis of the via posts to coin the solderable caps and (ii) applying heat to cause reflow of the solderable caps.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

Like reference numbers and designations in the various drawings indicated like elements.

DETAILED DESCRIPTION

In the description hereinbelow, support structures consisting of metal vias in a dielectric matrix, particularly, copper via posts in a polymer matrix, such as polyimide, epoxy or BT (Bismaleimide/Triazine) or their blends, reinforced with glass fibers are considered.

It is a feature of Access' photo-resist and pattern or panel plating and laminating technology, as described in U.S. Pat. Nos. 7,682,972, 7,669,320 and 7,635,641 to Hurwitz et al., incorporated herein by reference, that large panels comprising very large arrays of substrates with very many via posts may be fabricated. Such panels are substantially flat and substantially smooth.

It is a further feature of Access' technology that vias fabricated by electroplating using photoresists and may be narrower than vias created by drill & fill. At present, the narrowest drill & fill vias are about 60 microns. By electroplating using photoresists, a resolution of under 50 microns, or even as little as 30 microns is achievable. Coupling ICs to such substrates is challenging. One approach for flip chip coupling is to provide solder on pads (SoP) terminations, where solder bumps are applied to the support structure to terminate copper vias. This is difficult to achieve because of the fine pitch and small scale.

Embodiments of the present invention address this issue by providing solder bumps at the end of the copper vias of the support structure.

One embodiment consists of Cu pillars with a tin tip.

Figure 1:
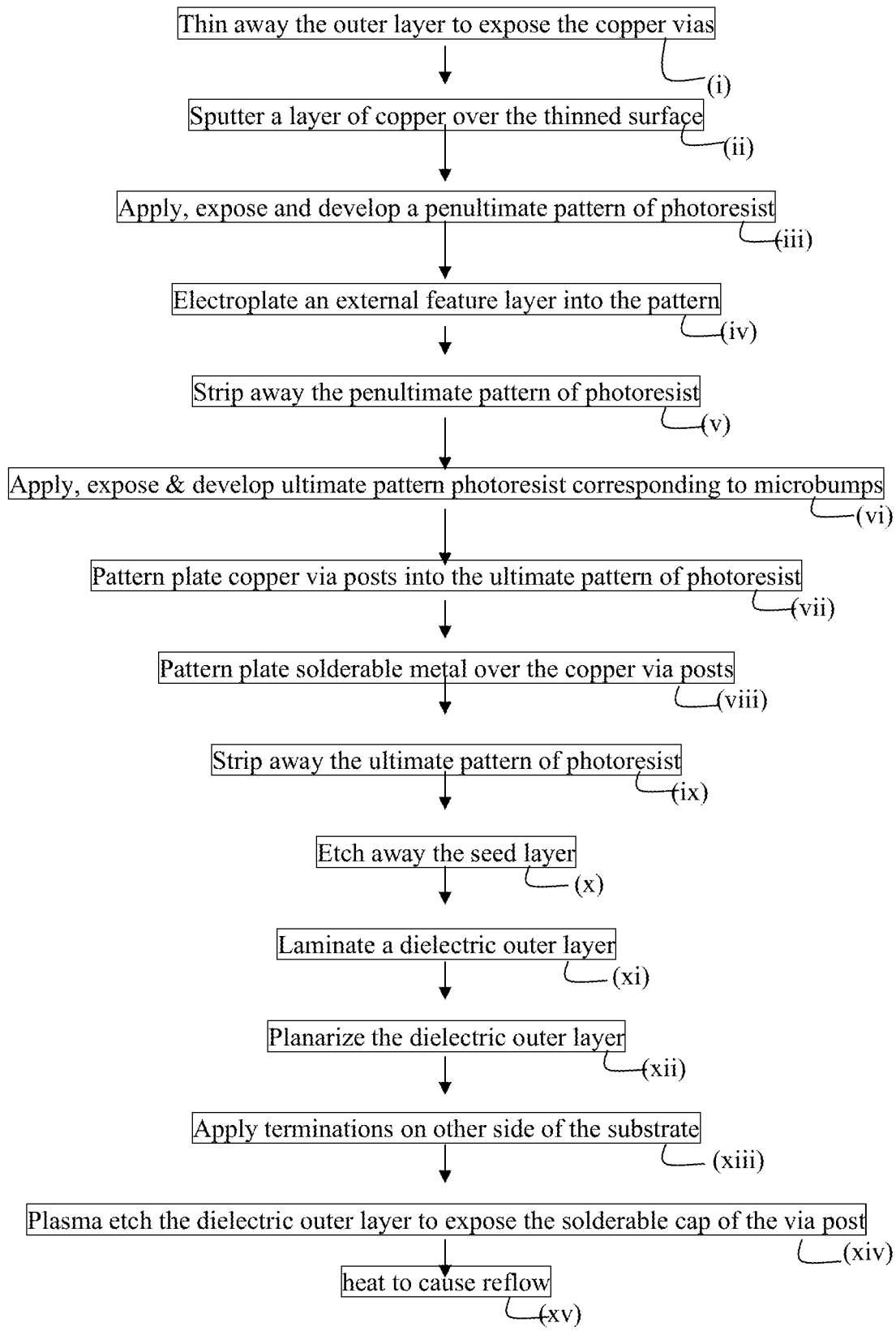
FIG. 1 is a flowchart illustrating the steps of a process for manufacturing very fine pitch ball grid array terminations on a multilayer composite electronic structure for connecting an IC thereto, using flip chip technology.

With reference to FIG. 1 and to FIGS. 2 to 15, a process for manufacturing very fine pitch ball grid array terminations on a multilayer composite electronic structure for connecting an IC thereto, using flipchip technology is described.

Figure 2:
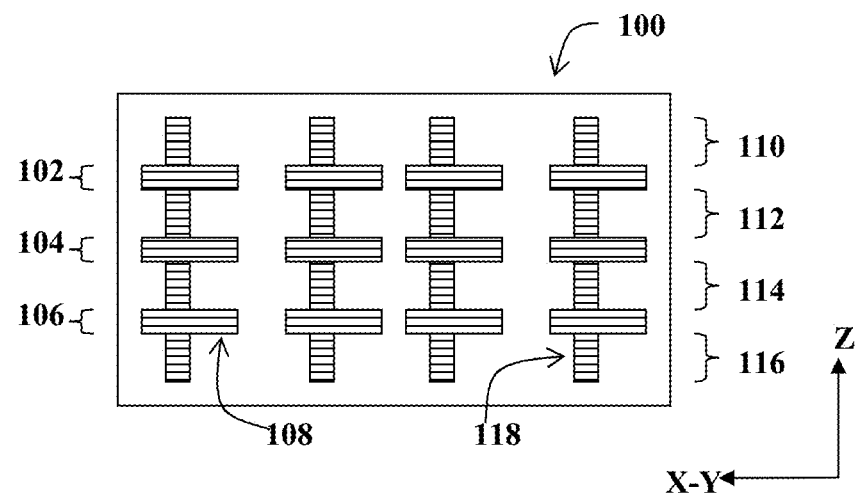
FIG. 2 is a schematic illustration of a multilayer composite electronic structure.

Firstly, a multilayer composite support structure of the prior art is obtained—step 1(i). As shown in FIG. 2 the multilayer support structures 100 includes functional layers 102, 104, 106 of components or features 108 separated by layers of dielectric 110, 112, 114, 116, which insulate the individual layers. Vias 118 through the dielectric layer provide electrical connection between features 108 in the adjacent functional or feature layers 102, 104, 106. Thus the feature layers 102, 104, 106 include features 108 generally laid out within the layer, in the X-Y plane, and vias 118 that conduct current across the dielectric layers 110, 112, 114, 116. Vias 118 are generally designed to have minimal inductance and are sufficiently separated to have minimum capacitances therebetween.

The vias could be fabricated by drill & fill, but to provide greater flexibility in fabrication, higher precision and more efficient processing by enabling large numbers of vias to be fabricated simultaneously, preferably the vias are fabricated by electroplating using the technology described in U.S. Pat. Nos. 7,682,972, 7,669,320 and 7,635,641 to Hurwitz et al. The via post technology allows different diameter vias, non circular vias, faraday cages, embedded passive components and other features. It will be appreciated that FIG. 2 is a schematic illustration for purposes of explanation. Real substrates may have more or less feature layers and more or less vias. Typically, substrates 100 comprise very large numbers of vias. The relative dimensions of vias, feature layers and dielectric, and, in subsequent schematics, of additional elements, are illustrative only, and are not to scale.

Figure 3:
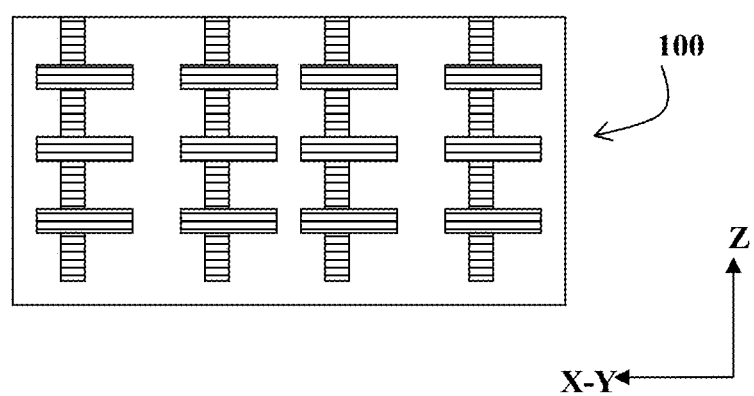
FIG. 3 is a schematic illustration of the multilayer composite electronic structure of FIG. 2 having a first side thinned to expose the ends of embedded pillars.
Figure 4:
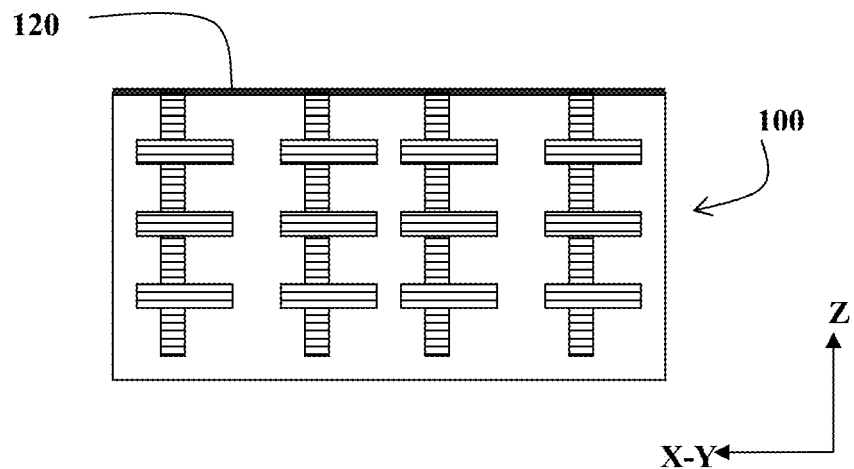
FIG. 4 is a schematic illustration of the multilayer composite electronic structure of FIG. 3 with a copper seed layer sputtered onto the thinned surface.

The side of the multilayer composite electronic structure 100 to which a chip is to be coupled by flip chip bonding is first thinned—step (ii) to expose the ends of the copper vias 110, see FIG. 3. Chemical, mechanical, or preferably, Chemical Mechanical Polishing CMP may be used. Next, a seed layer of copper 120 is sputtered over the thinned surface—step (iii). The resulting structure is schematic illustrated in FIG. 4.

Figure 5:
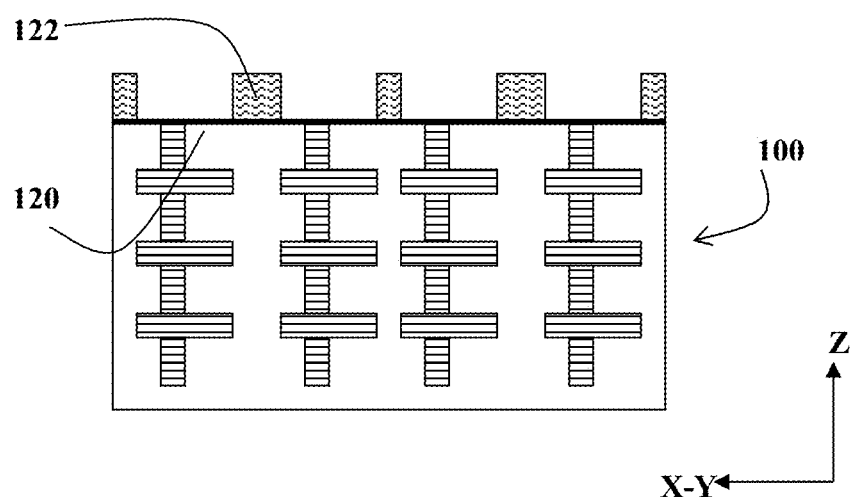
FIG. 5 is a schematic illustration of the multilayer composite electronic structure of FIG. 4 after application, exposure and developing of a photoresist to provide a pattern of pads.
Figure 6:
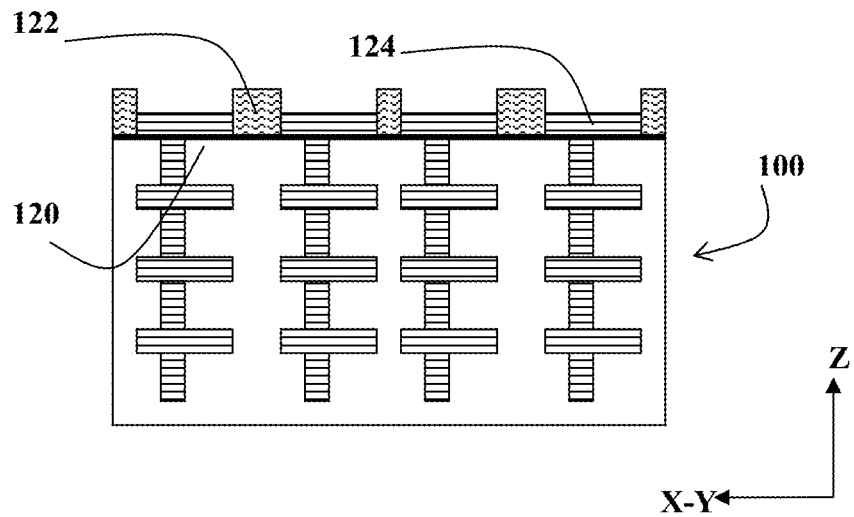
FIG. 6 is a schematic illustration of the multilayer composite electronic structure of FIG. 5 after plating copper into the photoresist.

With reference to FIG. 5, a layer of photoresist 122 is applied, exposed and developed to provide a pattern of pads—step (iv). As shown in FIG. 6, copper pads 124 are then plated into the photoresist—step (v), the copper seed layer 120 serving as an anode.

Figure 7:
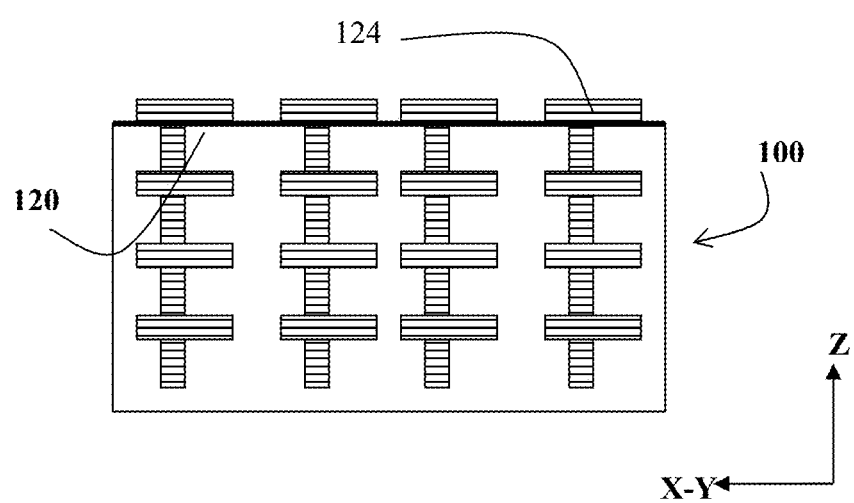
FIG. 7 is a schematic illustration of the multilayer composite electronic structure with upstanding copper pads after stripping away the photoresist.

Now, the photoresist 122 FIG. 7 is stripped away—step (vi), exposing the upstanding copper pads 124 and the seed layer 120 therebetween.

Figure 8:
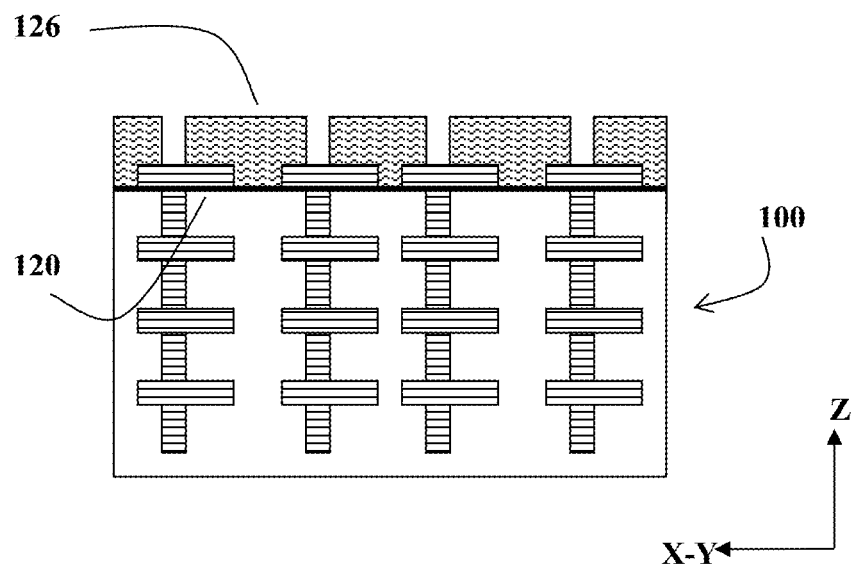
FIG. 8 is a schematic illustration of the multilayer composite electronic structure after application, exposure and developing of a photoresist to provide a pattern of termination pegs.

With reference to FIG. 8 a second layer of photoresist 126 is applied, exposed and developed to provide a pattern of termination pegs—step (vii).

Figure 9:
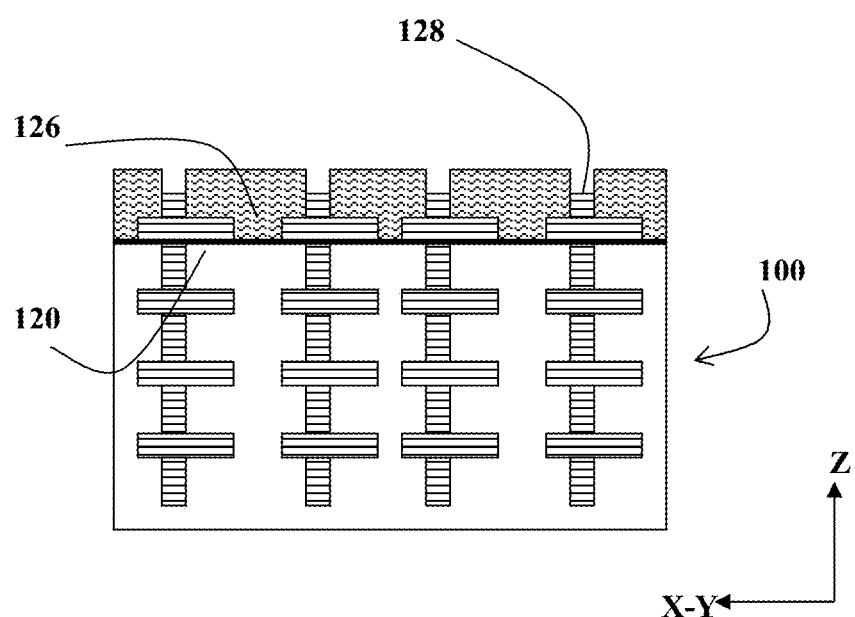
FIG. 9 is a schematic illustration of the multilayer composite electronic structure after plating copper into the patterned photoresist.

Copper is now plated into the patterned photoresist 126—Step (viii) to provide the structure schematically shown in FIG. 9.

Figure 10:
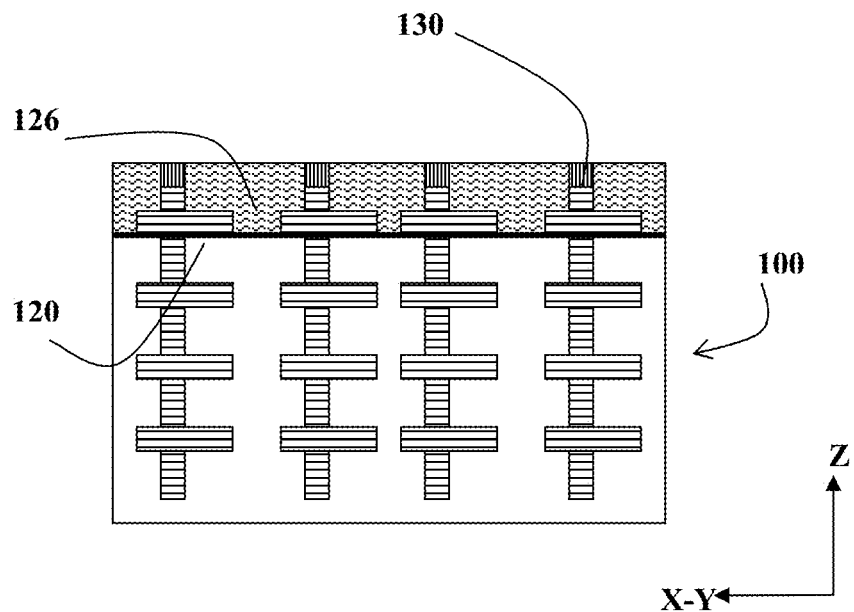
FIG. 10 is a schematic illustration of the multilayer composite electronic structure after plating a solderable metal or alloy over the copper into the patterned photoresist

A solderable metal or alloy 130, typically tin (Sn) is electroplated over the copper 128 into the patterned photoresist 126—step (ix), providing the structure illustrated schematically in FIG. 10.

There are various solderable alloys that may be electroplated. The most common of these is the tin-lead eutectic mixture $Sn_{63}Pb_{37}$ having a melting point of 183° C. Other solder materials include pure lead. However, in the drive to limit usage of lead, various lead free solders have been developed. These include pure tin, tin-silver $Sn_{96.5}Ag_{3.5}$ having a melting point of 221° C., and various tin silver copper alloys such as $Sn_{96.5}Ag_{3.0}Cu_{0.5}$ with a melting point of 218-219° C., $Sn_{95.8}Ag_{3.5}Cu_{0.7}$ with a melting point of 217-219° C., $Sn_{95.5}Ag_{3.8}Cu_{0.7}$ with a melting point of 217-219° C., $Sn_{95.2}Ag_{3.8}Cu_1$ with a melting point of 217° C. and $Sn_{95.5}Ag_4Cu_{0.5}$ with a melting point of 217-219° C. There are also some silver free compositions such as $Sn_{99.3}Cu_{0.7}$ with a melting point of 227° C. and $Sn_{99.3}Cu_{0.7}$+Ni with a melting point of 227° C. All of these electroplate well onto the shorted copper via posts within the photoresist. Another candidate material is pure tin. DOW Chemicals provides a sulfonic acid based tin plating solution Solderon ECT Matte Tin which has been found to perform very well.

It will be appreciated that aligning solder bumps with drill fill vias is extremely difficult and increasingly so as via diameters decrease and the number of vias per unit area increase. This lowers yields and reliability. In the present method described herein, the same pattern is used to electroplate via posts and the solder bumps thereon. This manufacturing technique totally overcomes these problems, ensuring good alignment of solder bumps with the underlying copper via posts.

Figure 11:
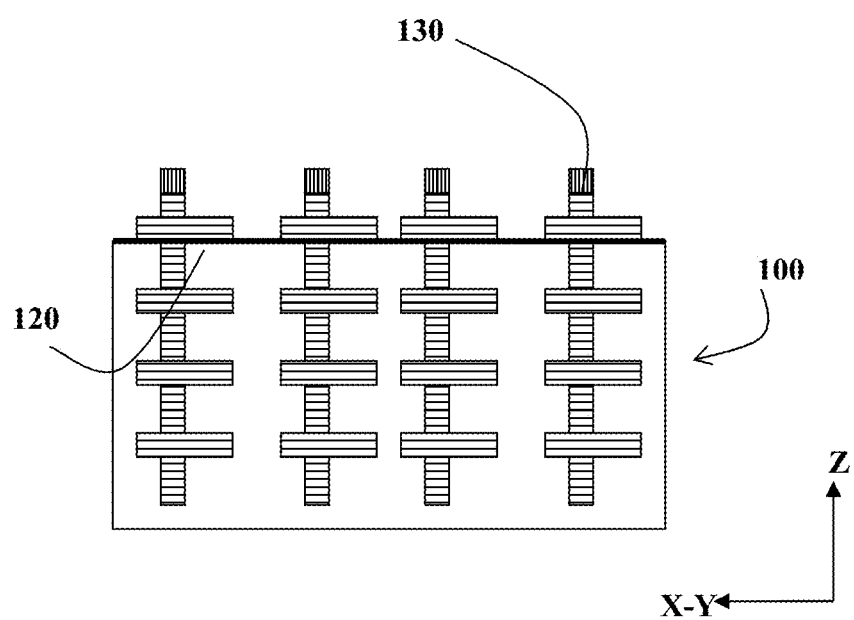
FIG. 11 is a schematic illustration of the multilayer composite electronic structure with an array of upstanding copper and solder bumps after stripping away the photoresist.
Figure 12:
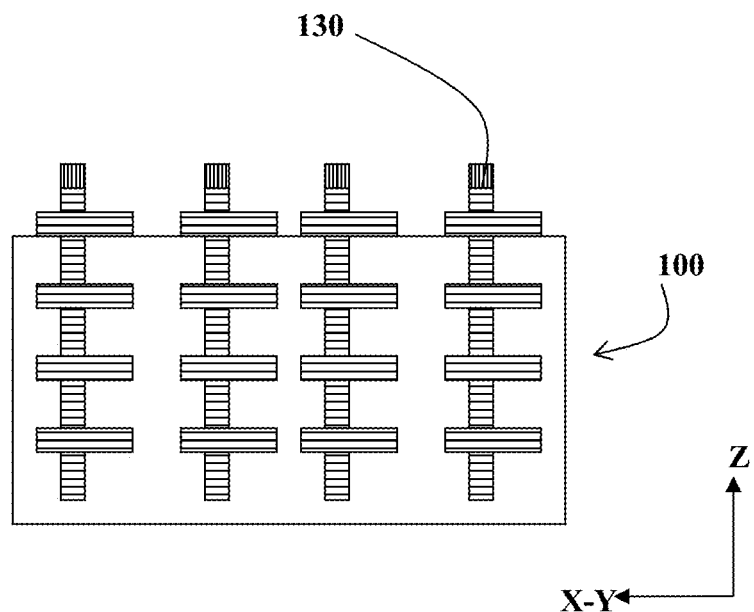
FIG. 12 is a schematic illustration of the multilayer composite electronic structure with an array of upstanding copper and solder bumps after etching away the copper seed layer.

The photoresist 126 is now stripped away—step x, providing the structure illustrated in FIG. 11 which shows the multilayer composite electronic structure with an array of upstanding copper and solder bumps.

The copper seed layer 120 is now etched away—step (xi). Providing the structure shown in FIG. 12.

Figure 13:
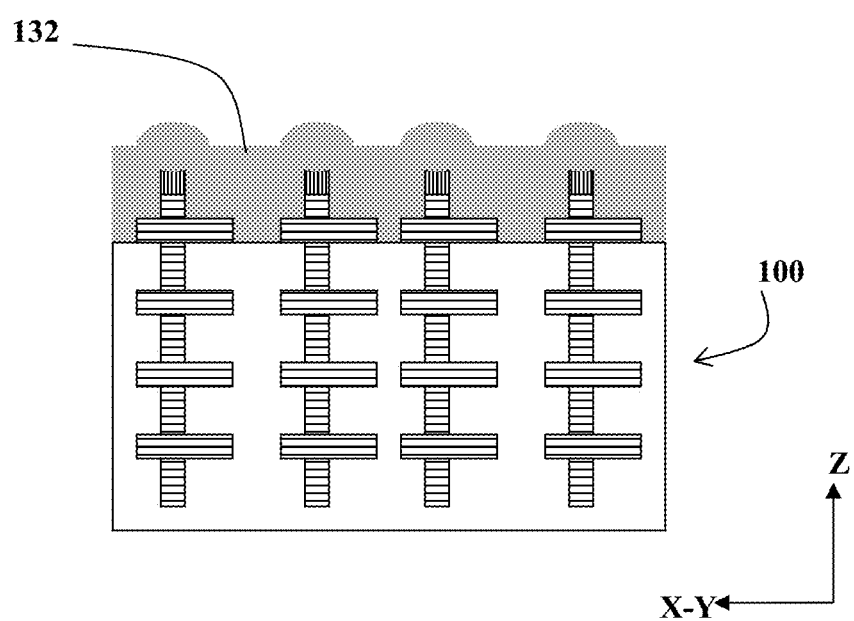
FIG. 13 is a schematic illustration of the multilayer composite electronic structure with a film dielectric or dry film solder mask laminated over the solder bumps array.

A film dielectric or dry film solder mask 132 is laminated—step (xii) over the array of solder bumps 130. A schematic illustration of the multilayer composite electronic structure 100 with the film dielectric or dry film solder mask 132 laminated over the array of solder bumps 130 is shown in FIG. 13.

Although not shown, it will be appreciated that refluxing whilst the solder caps 130 on the underlying copper via posts 128 are isolated from each other, is one way to prevent solder flow from shorting adjacent bumps.

Figure 14:
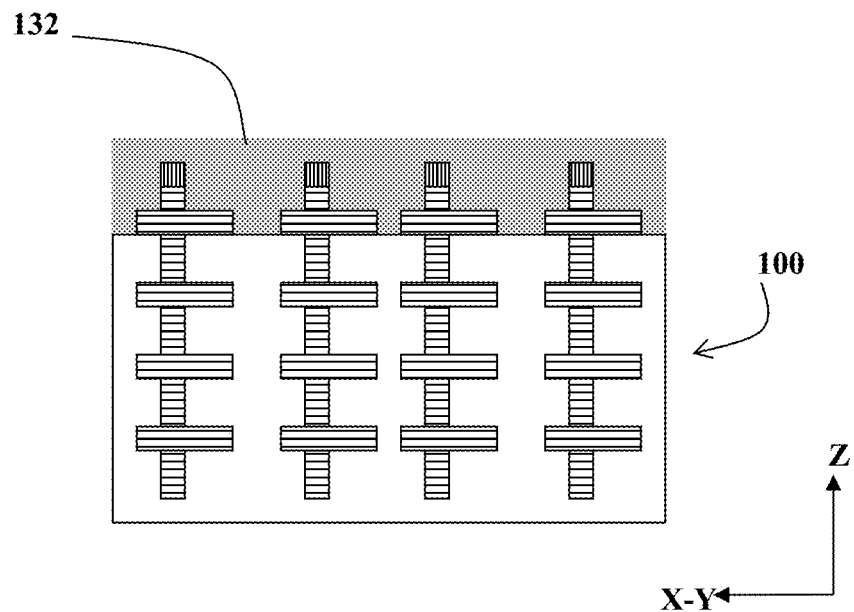
FIG. 14 is a schematic illustration of the multilayer composite electronic structure after an optional stage of planarizing the film dielectric or dry film solder mask laminated over the solder bumps array, typically using chemical mechanical polishing (CMP)

Often, surface of the film dielectric/dry film solder mask 132 is rather bumpy, and optionally, the film dielectric/dry film solder mask 132 is planarized—step (xiii), see FIG. 14, typically using chemical mechanical polishing (CMP).

At this stage, it is convenient to terminate the other side of the substrate 100 with a ball grid array. The process for so doing is shown in FIG. 25, and the various structures are illustrated in FIG. 15 to FIG. 24.

Figure 15:
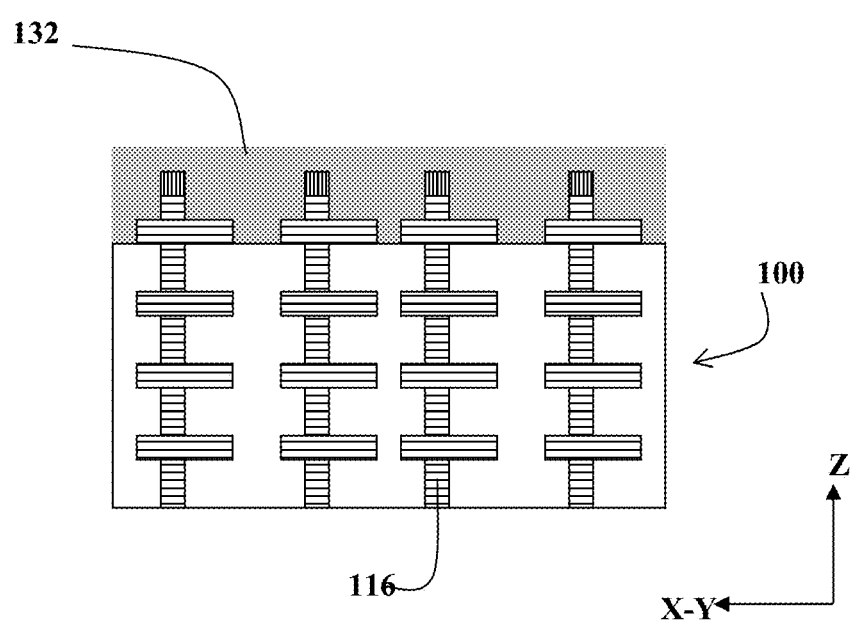
FIG. 15 a shows the other side of the multilayer composite electronic structure ground down to expose the ends of the copper vias.
Figure 16:
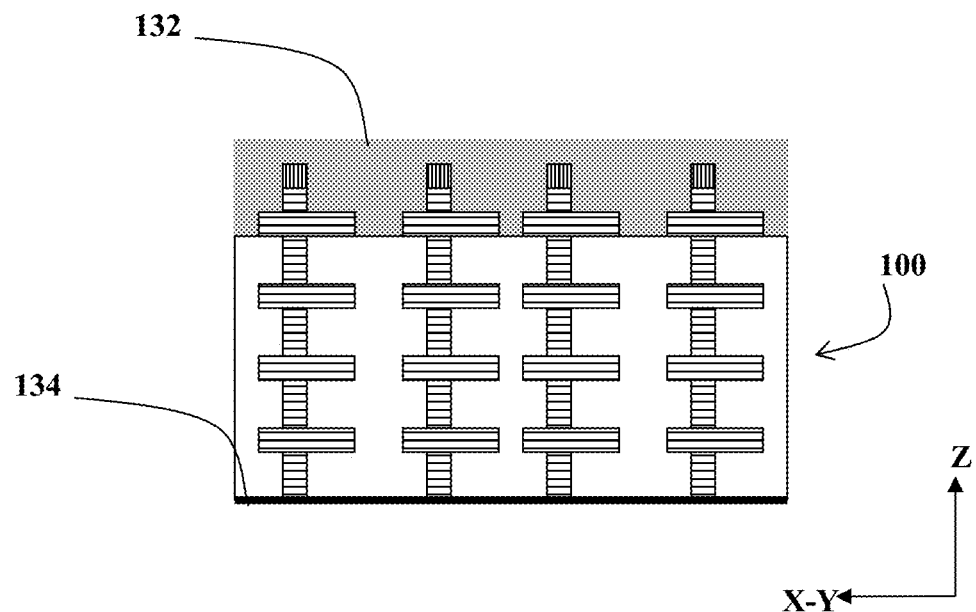
FIG. 16 shows the other side of the multilayer composite electronic structure with a copper seed layer sputtered thereon.
Figure 17:
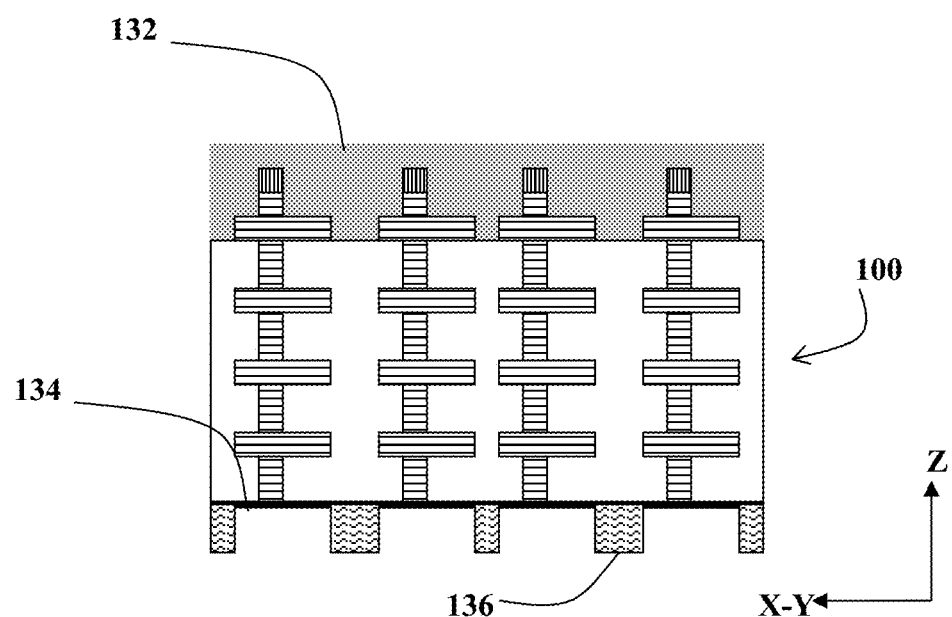
FIG. 17 shows the other side of the multilayer composite electronic structure with a pattern of photoresist after application, exposure and development.
Figure 18:
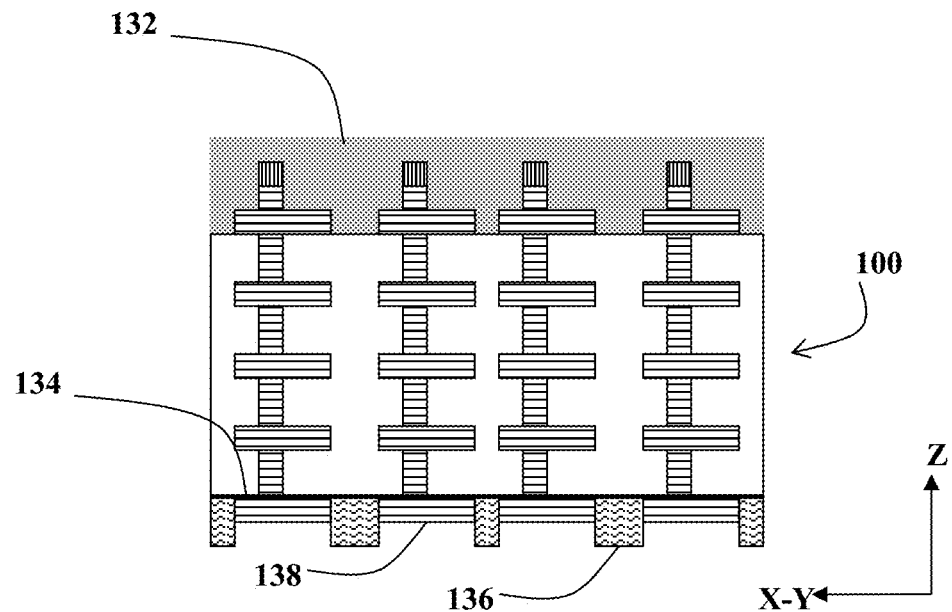
FIG. 18 shows the other side of the multilayer composite electronic structure with a copper layer electroplated into the pattern of photoresist.
Figure 19:
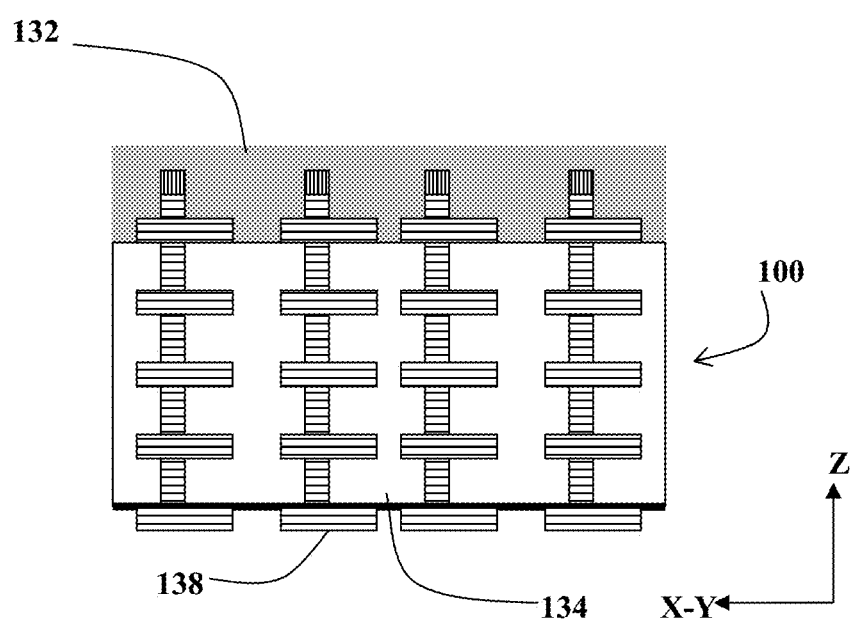
FIG. 19 shows the other side of the multilayer composite electronic structure after stripping away the photoresist.
Figure 20:
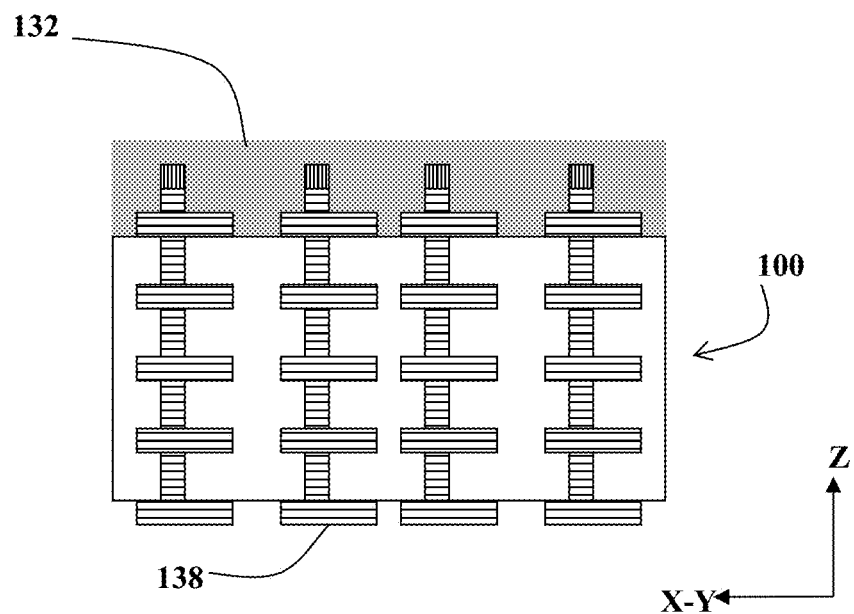
FIG. 20 shows the other side of the multilayer composite electronic structure after etching away the seed layer.
Figure 21:
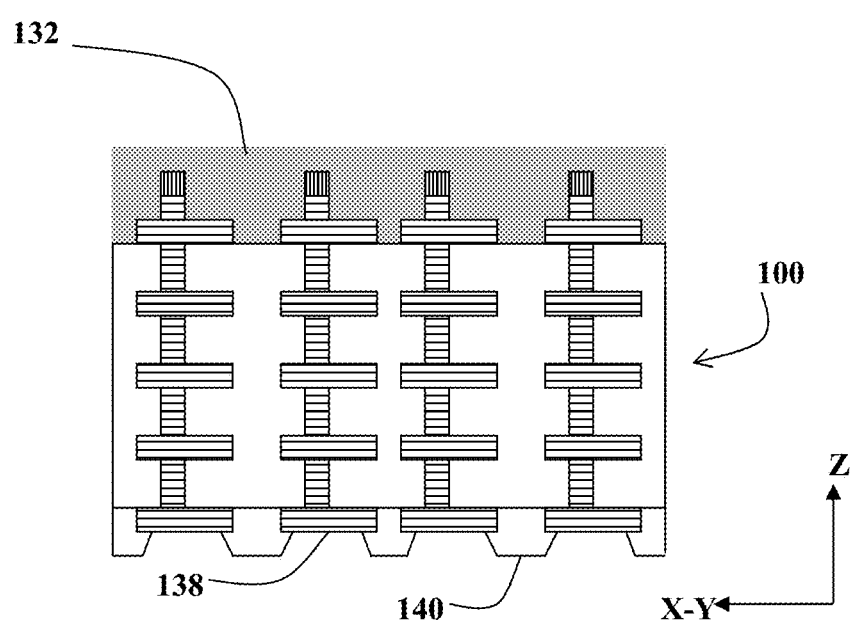
FIG. 21 shows the other side of the multilayer composite electronic structure after depositing a patterned solder mask.
Figure 23:
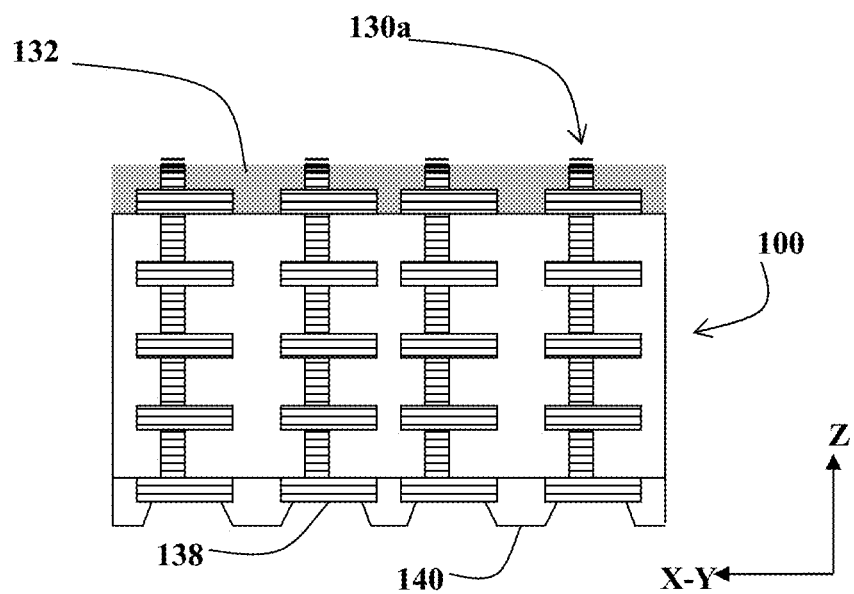
FIG. 23 shows the first side after densifying under pressure.
Figure 24:
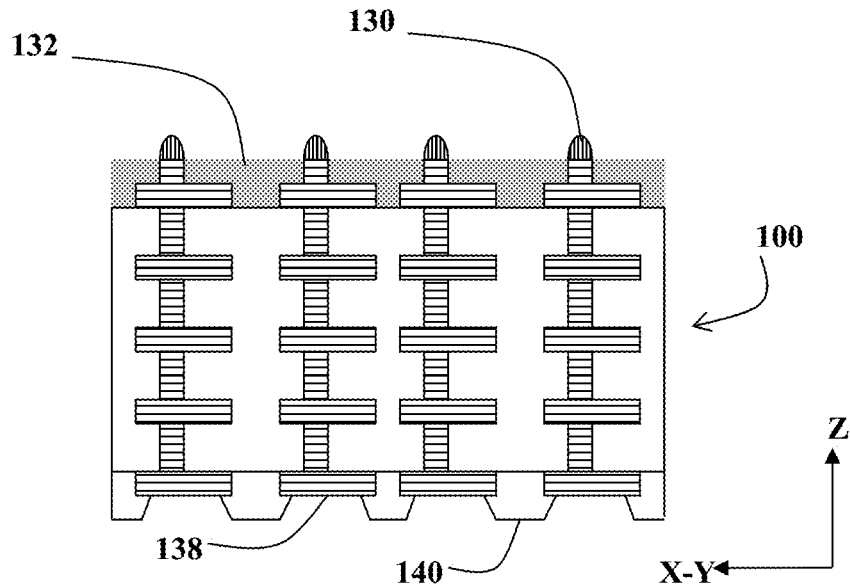
FIG. 24 shows the first side after densifying by reflow.
Figure 25:
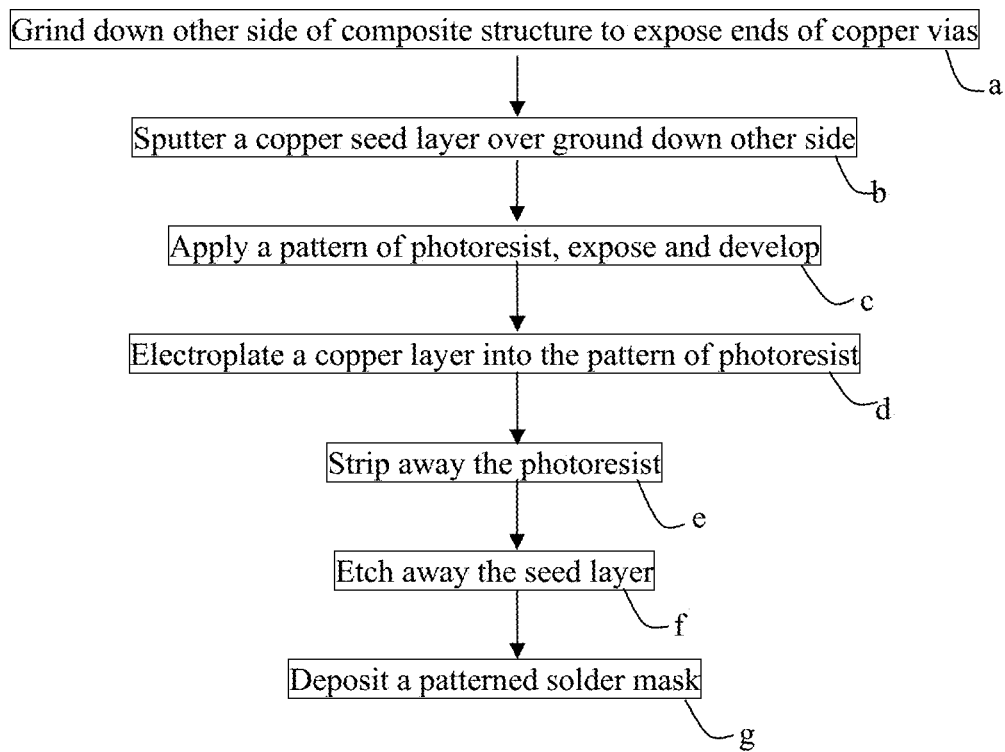
FIG. 25 is a flowchart illustrating the process for terminating the other side of the substrate with a ball grid array.

Thus, with reference to FIG. 15 to FIG. 24 and to FIG. 25, to terminate the other side of the multilayer composite electronic structure 100, the other side is ground down—step a, to expose the ends of the copper vias 116, as schematically shown in FIG. 15. Copper is then sputtered—step b—over the ground surface to form a copper seed layer 134 as schematically shown in FIG. 16. Referring to FIG. 17 photoresist 136 is now applied, exposed and developed—step c. As shown in FIG. 18, a copper layer 138 is now electroplated—step d—into the pattern of photoresist 136. The photoresist 136 is now stripped away—step e, providing the structure as illustrated in FIG. 19. The seed layer 134 is now etched away—step f, providing the structure illustrated in FIG. 20, and then a patterned solder mask 140 is applied—step g—around and overlapping the copper pads 138. forming the structure shown in FIG. 21.

Solder balls may then be applied onto the copper pads 138 to create a ball grid array (BGA) interconnect of the finished package (after die assembly).

Figure 26:
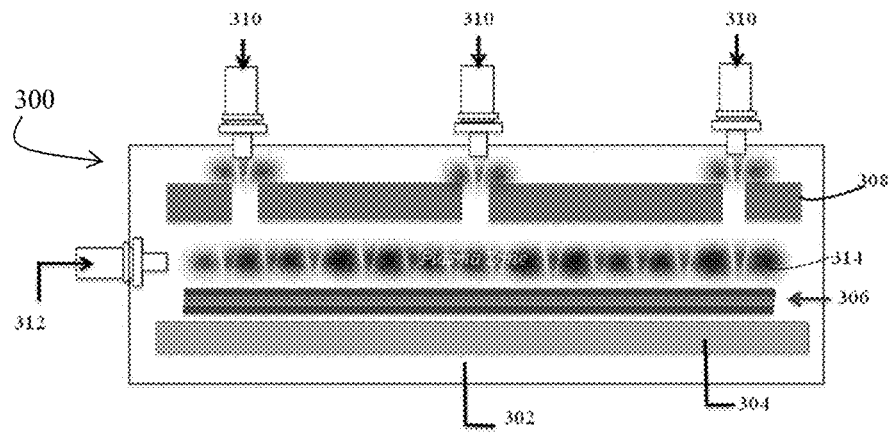
FIG. 26 is a schematic illustration of an in-line plasma etching station.

With reference to FIG. 26, an in-line plasma etching station 300 is schematically shown. This consists of a vacuum chamber 302 within which a carrier 304 supports a substrate 306. Gases to be ionized for the plasma etching process, such as Oxygen, Tetrafluoro-carbon ($CF_4$) and Argon, for example, may be introduced through inlet 312 into the vacuum chamber 302. By maintaining a potential difference between the substrate 306 and an upper electrode 308, a plasma zone 314 is created. Optical emission spectrometer analyzers 310 detect the end point when the Sn is exposed and the copper is just covered in real time, allowing accurate computer control.

Figure 22:
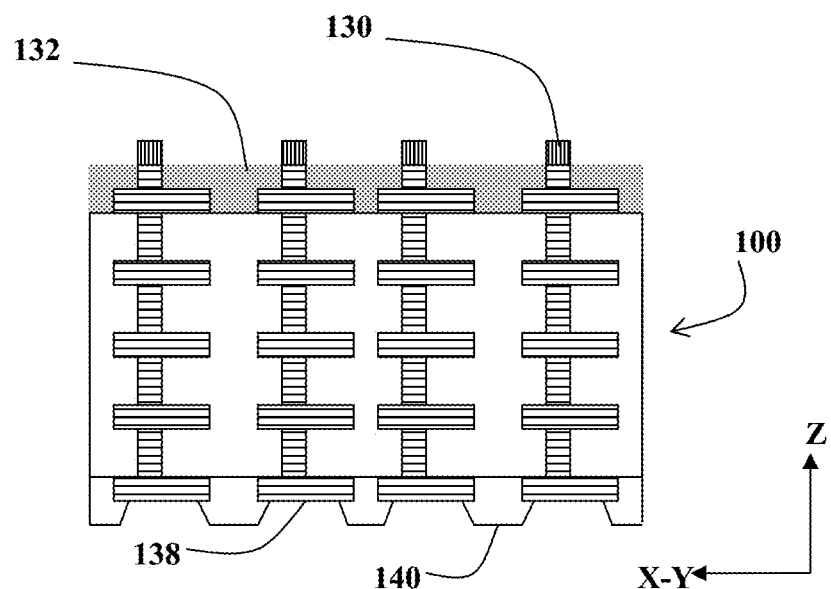
FIG. 22 shows the first side after thinning the dielectric film to expose the solderable cap over the copper via post.

By an ion assisted plasma etching process using the equipment 300 schematically shown in FIG. 3, the dielectric film 132 may be removed to expose the solderable cap 130, typically of tin or a tin alloy—step (xv), see FIG. 22.

After electroplating, solderable alloys may include high surface roughness that without the usage of the right flux material during die assembly—may create voids between the substrate bumps to the die bumps during the die assembly process. As a result, it is often required to apply a finishing treatment such as to "smooth" or "coin" the top surface of the electro-plated bump on the substrate in order to further ease and assist with the flip chip assembly process—step (xvi)a. Different surface treatment techniques may be used.

For example, with reference to FIG. 23, by applying pressure along the axis of the via posts in a press, for example, the solderable caps may be coined. To aid this process, heat may also be applied, to cause reflow of the substrate bumps. Having an array of flat solderable caps with a fine, smooth surface 130a aids attachment of a bump array of a flip chip and prevents voids at the interface of the die to substrate bumps.

Alternatively, and usefully for attachment of low I/O count die(s) that do not contain bumps, the solderable caps on the substrate may be exposed to sufficient heat to cause reflow, which, in the absence of a compressing force to generate coining, results in the solderable material melting and forming dome shaped caps 130b due to surface tension of the solder meniscus—FIG. 24. In this case the non-coined bumps on the substrate may be directly attached to non bumped die—directly on its flat pads that may contain Ni/Au or other final metal finishes.

It will be appreciated that compaction, with or without reflow ensures that the solderable caps 130 are isolated from each other, which helps prevent solder flow shorting adjacent bumps.

Figure 27:
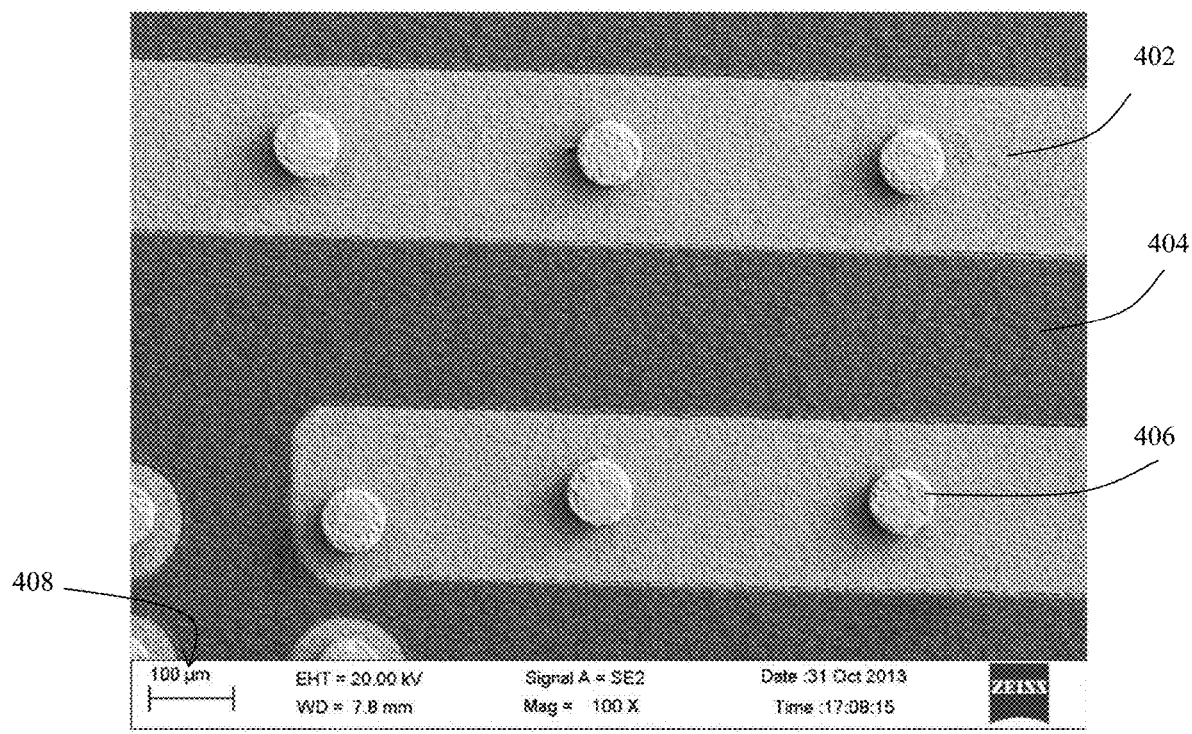
FIG. 27 is a scanning electron micro photograph (SEM micrograph) showing copper pads separated with dielectric on the surface of a substrate and showing upstanding copper via posts thereupon from above, i.e. from an angle of 0°.

With reference to FIG. 27, there is shown a scanning electron microphotograph (SEM micrograph) showing copper pads 402 separated with dielectric 404 on the surface of a substrate and showing upstanding copper via posts 406 thereupon from above, i.e. from an angle of 0°. The scale bar is 100 microns, and shows that the via posts are approx. 50 microns in diameter.

Figure 28:
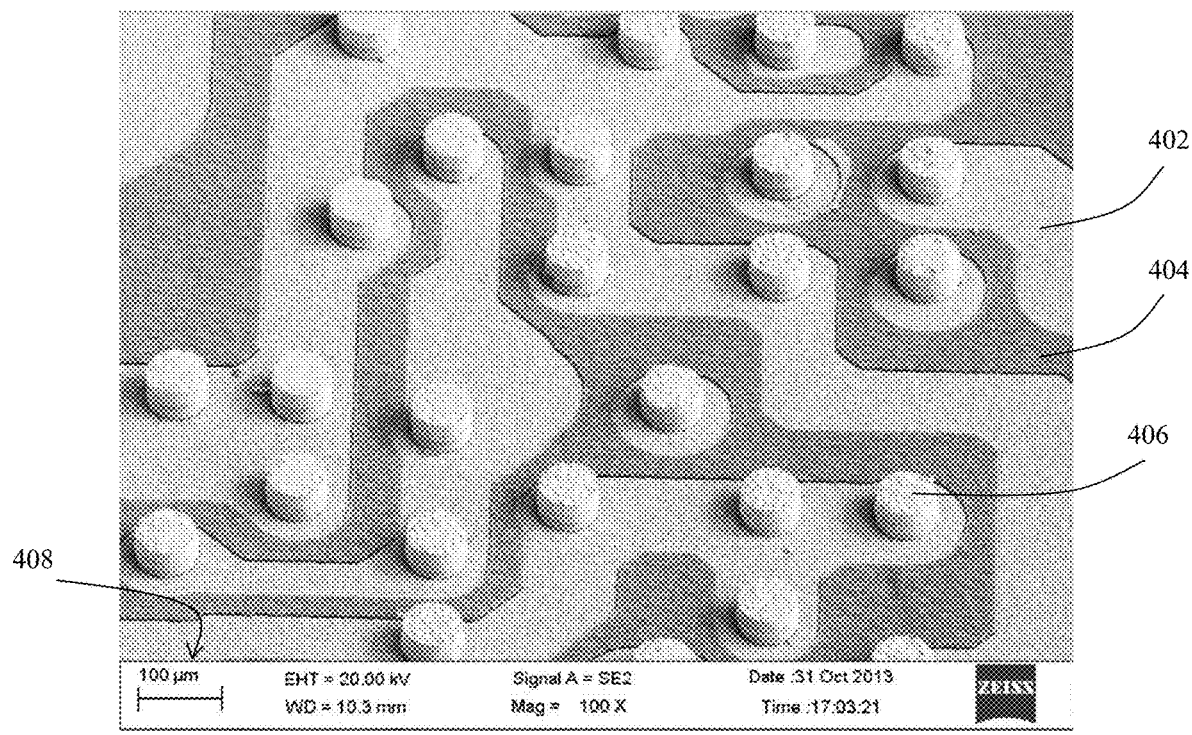
FIG. 28 is a scanning electron micrograph showing copper pads separated with dielectric on the surface of the substrate and having upstanding copper via posts thereupon from above and from an angle of 45°, at a magnifications such that the scale bar is 100 microns.

Referring to FIG. 28 there is shown a scanning electron micrograph showing copper pads separated with dielectric on the surface of the substrate and having upstanding copper via posts thereupon from above and from an angle of 45°, at a magnifications such that the scale bar is 100 microns.

Figure 29:
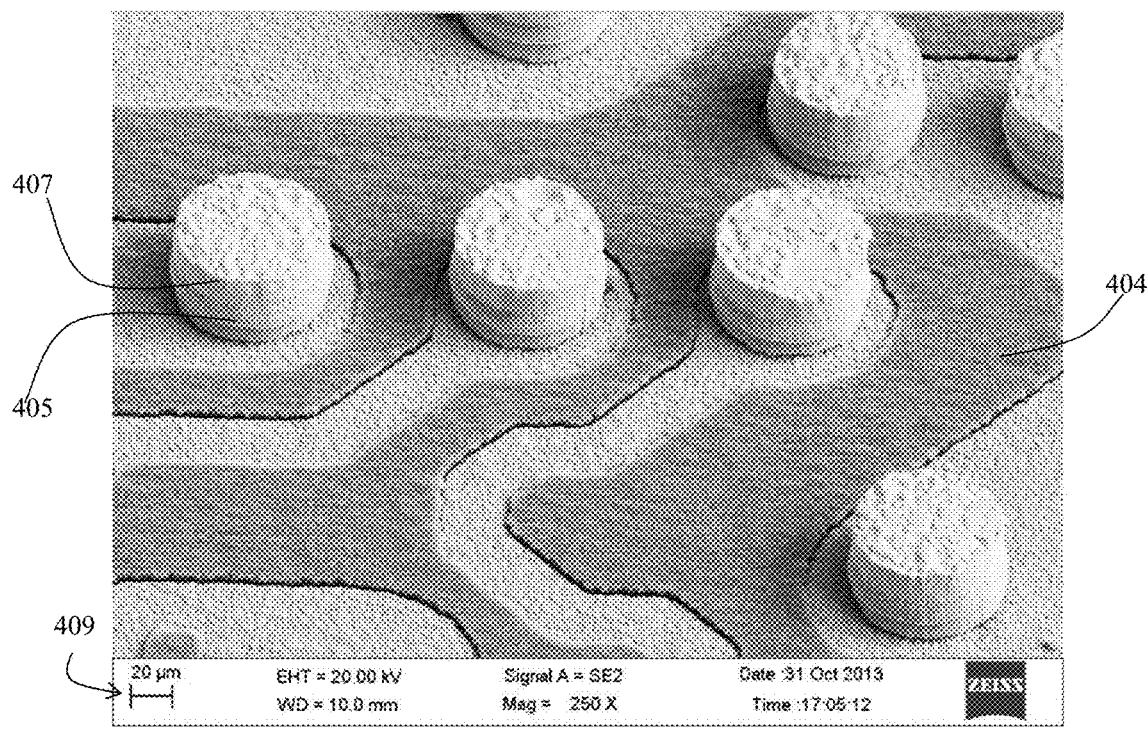
FIG. 29 is a scanning electron micrograph showing copper pads separated with dielectric on the surface of the substrate and having upstanding copper via posts thereupon from above and from an angle of 45°, at a magnifications such that the scale bar is 20 microns, and the copper via post and tin layer electroplated thereover are both clearly visible.

With reference to FIG. 29 a scanning electron micrograph is shown, illustrating copper pads 402 separated with dielectric 404 on the surface of the substrate and having upstanding copper via posts thereupon from above and from an angle of 45°, at a magnifications such that the scale bar 409 is 20 microns, and the copper via post 405 and tin layer 407 electroplated thereover are both clearly visible, the denser tin 407 is lighter than the copper 405.

Figure 30:
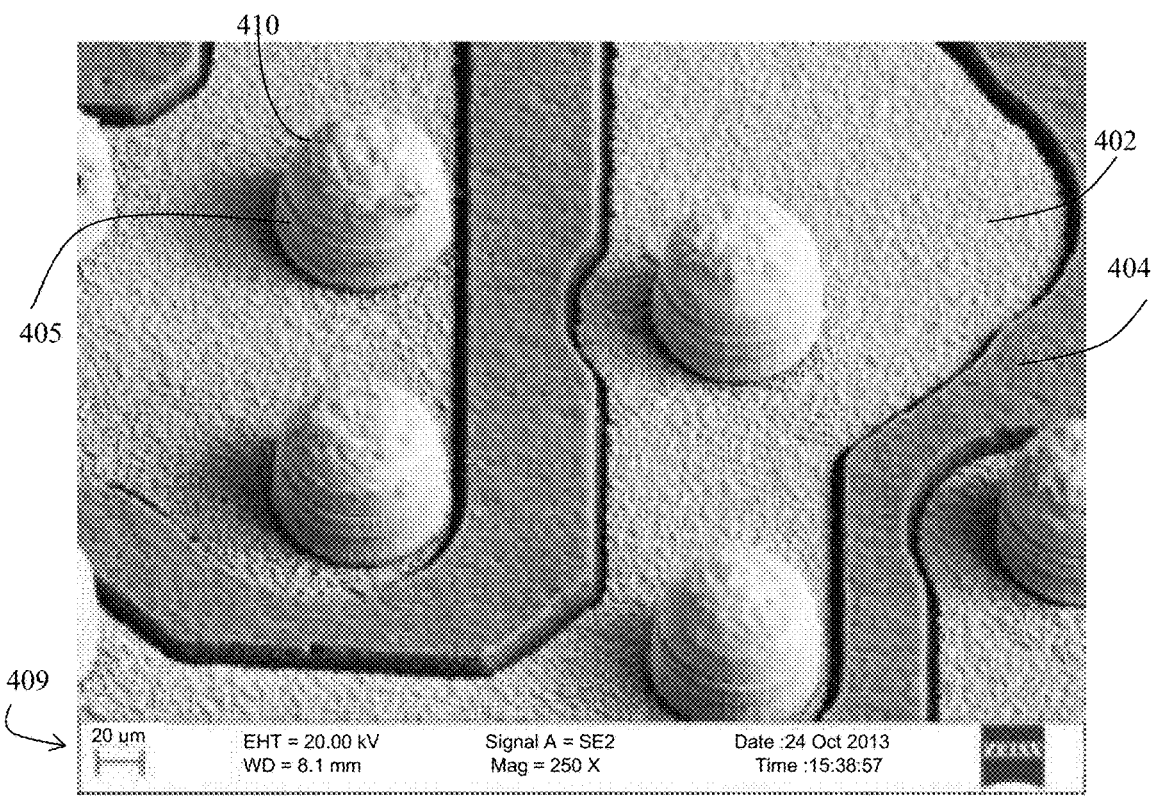
FIG. 30, is a scanning electron micrograph at the magnification and tilt of FIG. 4c, showing the tin layer 410 as a dome, after reflow.

With reference to FIG. 30, there is shown a scanning electron micrograph at the magnification and tilt of FIG. 29, showing the tin layer 410 as a dome, after reflow. This is the type of finish obtained by the process step xvi, variation b.

Figure 31:
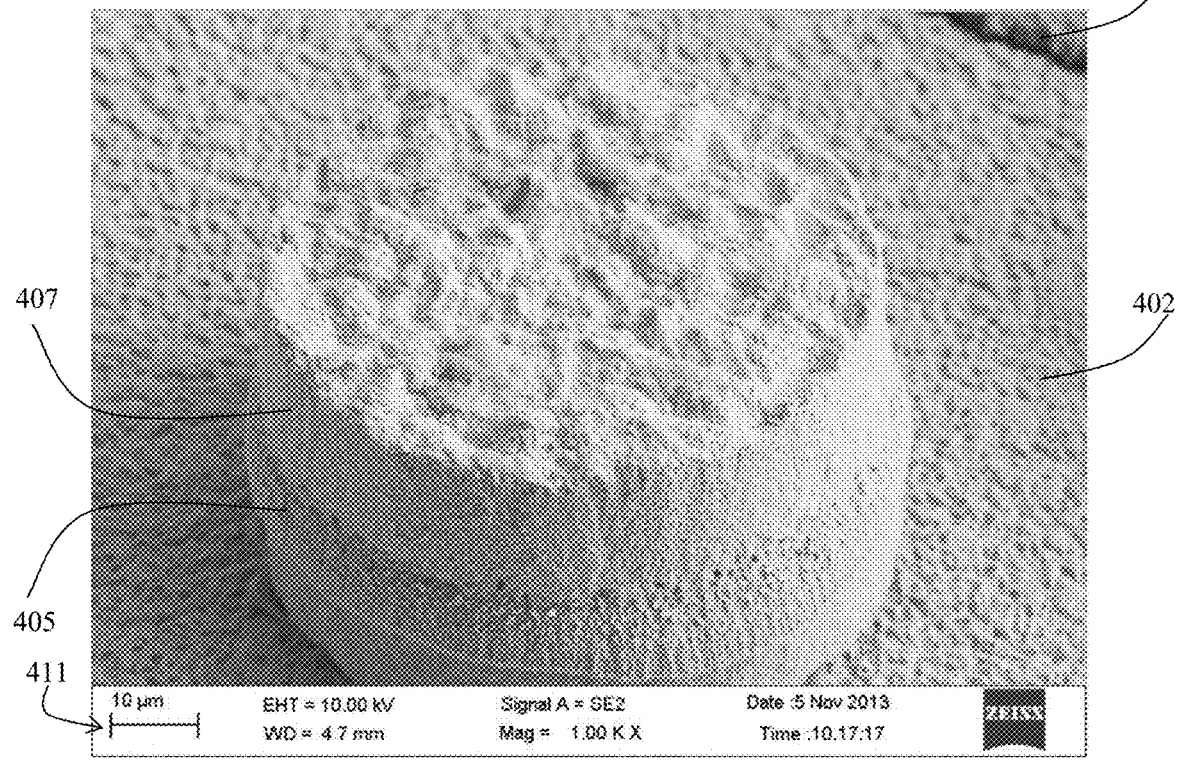
FIG. 31 is a scanning electron micrograph at very high magnification wherein the scale bar is 10 microns. An upstanding copper via 405 with a tin cap 407 electroplated thereover using the same patterned photoresist to achieve perfect alignment is shown.

Referring to FIG. 31, a scanning electron micrograph at very high magnification is shown, wherein the scale bar 411 shows 10 microns. This shows an upstanding copper via 405 with a tin cap 407 electroplated thereover using the same patterned photoresist to achieve perfect alignment.

Figure 32:
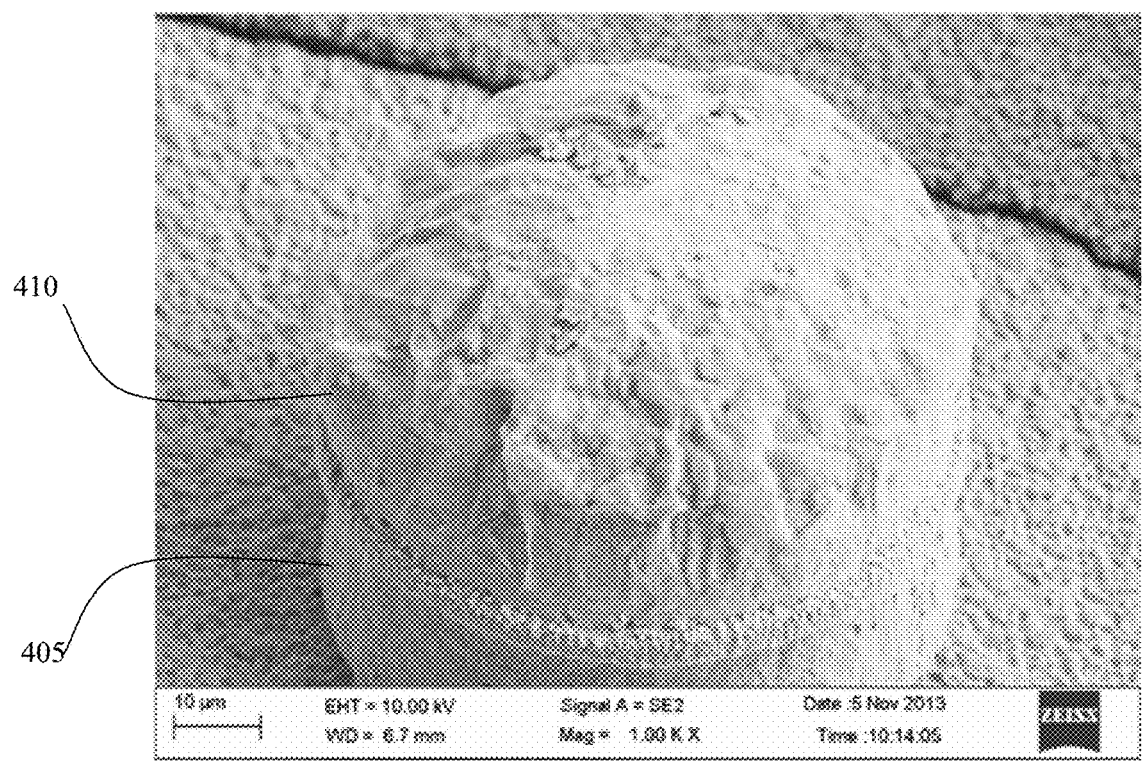
FIG. 32 is a scanning electron micrograph at very high magnification wherein the scale bar is 10 microns. An upstanding copper via 405 with a tin cap 407 electroplated thereover as per FIG. 30, but after subjecting to reflow.

In FIG. 32, a scanning electron micrograph at the very high magnification of FIG. 4e is shown, wherein the scale bar shows 10 microns. Here, the tin cap 410 has been subject to heat and, due to reflow, has assumed a dome shape 410. This is the type of finish obtained by the process step xvi, variation b.

Figure 33:
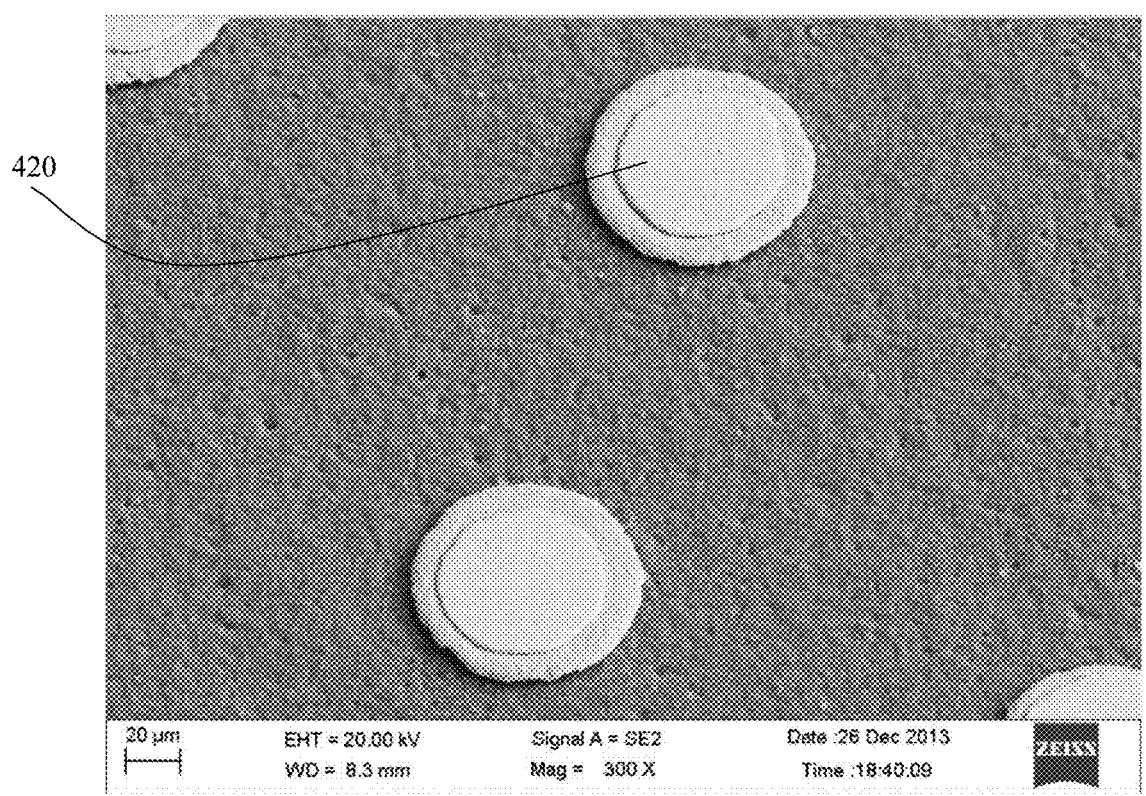
FIG. 33 is an intermediate magnification scanning electron micrograph of solderable caps that have been subjected to pressure in the direction of the axis of the via posts.
Figure 34:
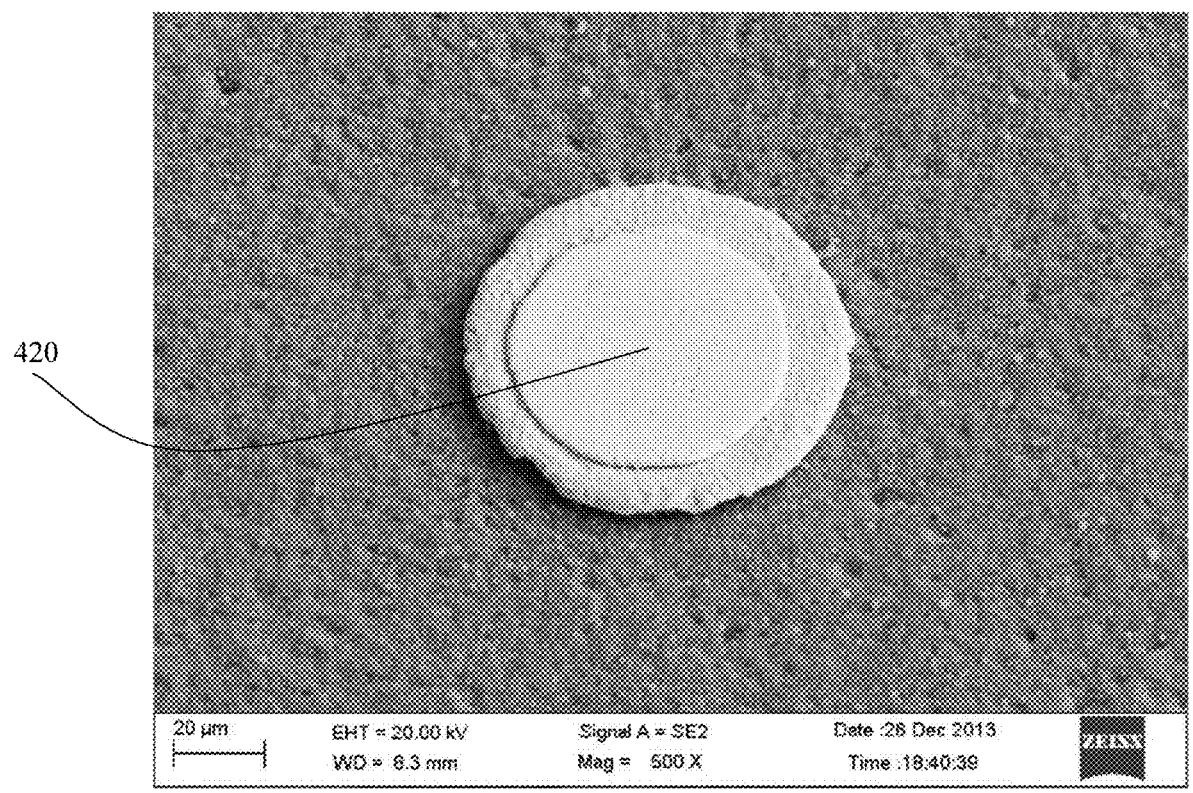
FIG. 34 is a higher magnification scanning electron micrograph of a solderable cap that that has been pressed in the direction of the axis of the via posts.

Referring to FIG. 33, an electron micrograph wherein a couple of solderable caps 420 that have been subjected to a pressing force without reflow are shown. In FIG. 34, a single solderable cap that have been subjected to a pressing force without reflow is shown. Applying pressure compresses the solderable caps and densifies them, providing a surface to which the bumps of a flip chip IC may be attached.

Figure 35:
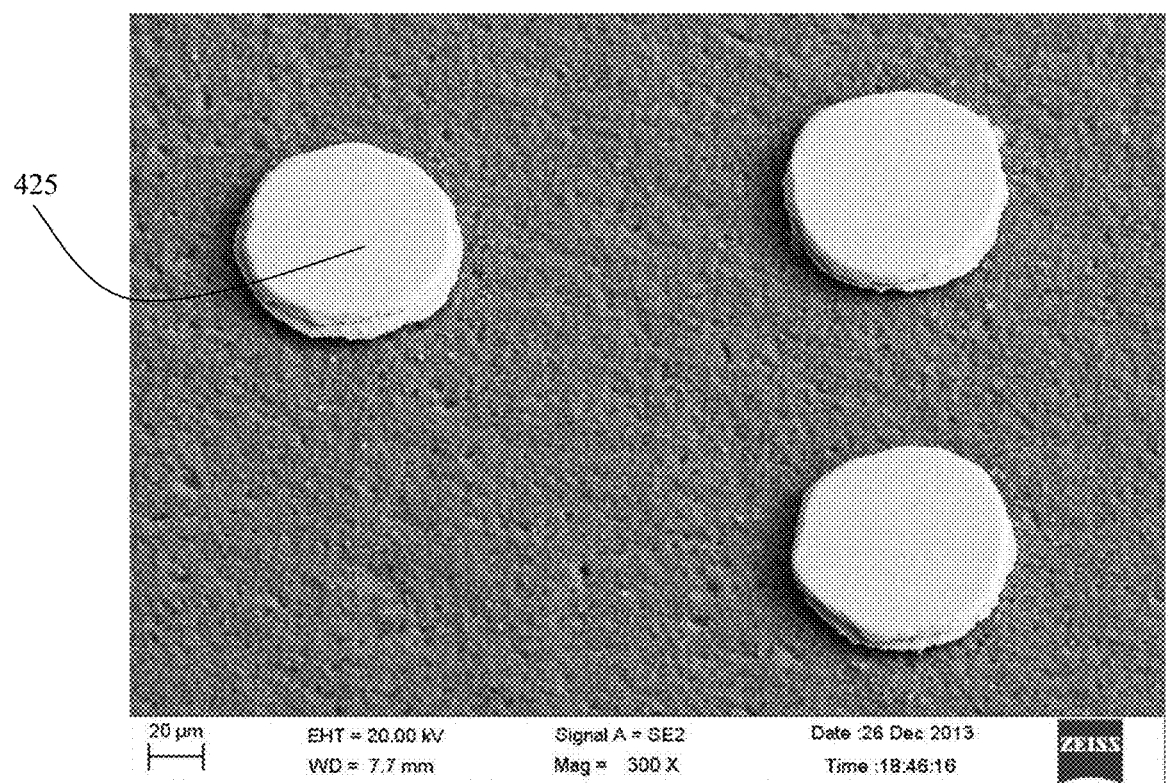
FIG. 35 is an intermediate magnification scanning electron micrograph of solderable caps that have been subjected to pressure in the direction of the axis of the via posts.
Figure 36:
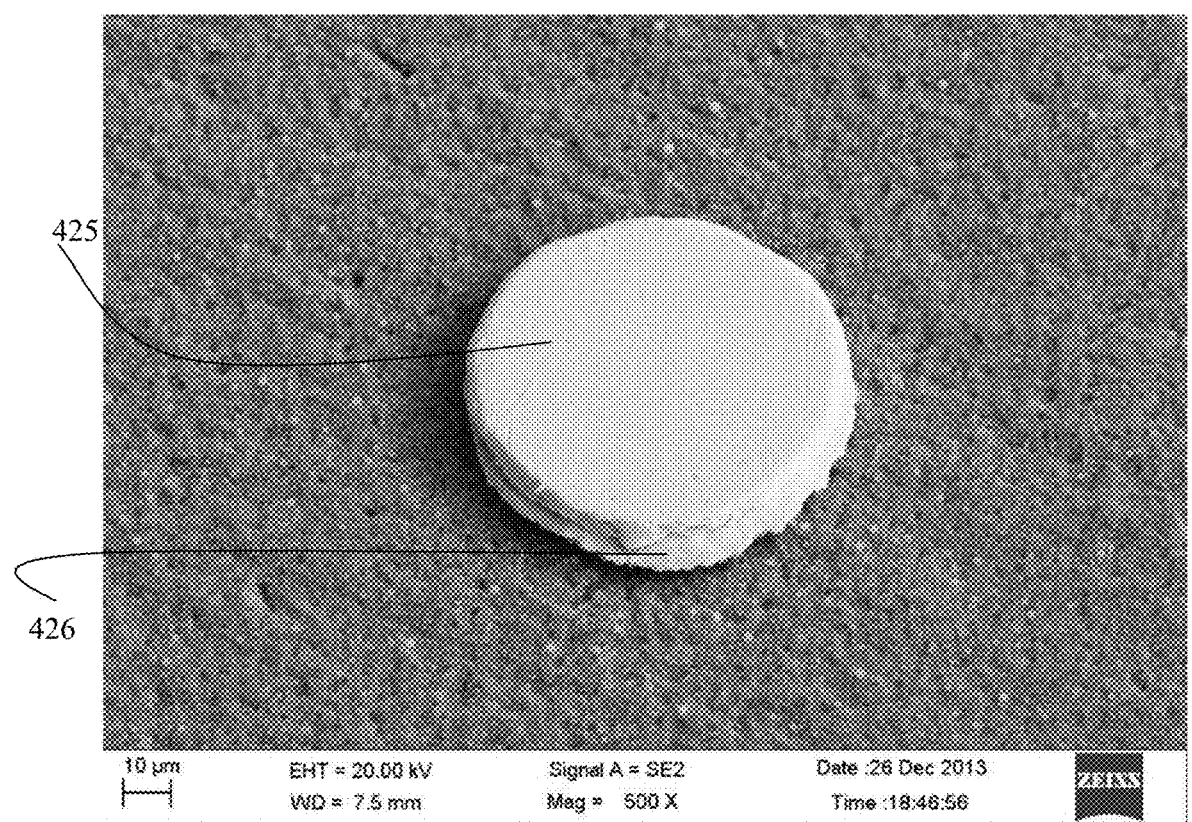
FIG. 36 is a higher magnification scanning electron micrograph of a solderable cap that that has been subjected to pressure in the direction of the axis of the via posts by inserting into a press, and heated to cause reflow.

Referring to FIG. 35 and FIG. 36, copper vias 426 with compressed reflowed solderable caps 425 that have been subjected to pressure and reflow at the same time are shown. By supplying pressure and heat, flat, dense solderable caps are obtained which are dense and well adhered to the copper vias.

Ideally the substrate bump has a similar diameter to the solder bumps on the chips. There are typically 60 µm to 110 µm. The technology described hereinabove allows bump diameters of as little as 35 µm. These may be separated by a spacing of about 20 µm, providing a pitch of 55 µm. Indeed, micro bumps of 15 micron diameter separated by 15 micron spaces are also possible.

There are a number of polymer dielectric films that are commercially available that have been found appropriate for laminating the very high pitch substrate arrays of the outer layers. These include NX04H available from Sekisui, HBI-800TR67680 available from Taiyo and GX-13 available from Ajinomoto.

The above description is provided by way of explanation only. It will be appreciated that the present invention is capable of many variations.

Several embodiments of the present invention have been described. Nevertheless, it will be understood that various modifications may be made without departing from the spirit and scope of the invention. Accordingly, other embodiments are within the scope of the following claims.

Thus persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. A method of terminating a first side of a multilayer composite structure having an outer layer of copper via posts embedded in a dielectric film, comprising the steps of:
   (i) thinning away a surface of the dielectric film to expose the copper via posts;
   (ii) sputtering a seed layer of copper over the thinned surface;
   (iii) applying, exposing and developing a penultimate pattern of photoresist over the sputtered layer of copper corresponding to a desired pattern for an external feature layer;
   (iv) electroplating the external feature layer into the penultimate pattern;
   (v) stripping away the penultimate pattern of photoresist;
   (vi) applying, exposing and developing an ultimate pattern of photoresist onto the external feature layer corresponding to a desired pattern of micro bumps;
   (vii) pattern plating copper via posts into the ultimate pattern of photoresist;
   (viii) pattern plating solderable metal over the copper via posts;
   (ix) stripping away the ultimate pattern of photoresist;
   (x) etching away the seed layer of copper;
   (xi) laminating a dielectric outer layer over the external feature layer and via posts;
   (xiv) plasma etching the dielectric outer layer to expose a solderable cap of the via post; and
   (xv) applying a finishing treatment to the solderable cap.

2. The method of claim 1 wherein the dielectric outer layer is selected from the group consisting of a film dielectric and a dry film solder mask.

3. The method of claim 1 wherein step (xv) comprises applying pressure to the solderable cap along an axis of the via post resulting in a flat coined solderable cap.

4. The method of claim 1 wherein step (xv) comprises applying pressure along an axis of the via post together with heat to cause reflow under pressure, resulting in a flat coined solderable cap.

5. The method of claim 1 wherein step (xv) comprises applying heat to cause reflow of the solderable cap, without applying pressure such that the solderable cap assumes a dome shape due to surface tension.

6. The method of claim 1 wherein step (xiv) of plasma etching comprises exposing the dielectric outer layer to ion bombardment in a low pressure atmosphere produced by ionizing at least one of the gases selected from the group consisting of oxygen, tetrafluoride carbon and fluorine.

7. The method of claim 1 further comprising step (xiii) of applying terminations on a second side of the substrate opposite to the first side.

8. The method of claim 7, wherein applying terminations comprises:
   (a) thinning the second side to expose an end of the copper vias;
   (b) sputtering a copper seed layer;
   (c) applying, exposing and developing a layer of photoresist over the sputtered copper layer to produce a pattern of pads;
   (d) electroplating copper pads into the photoresist;
   (e) removing the layer of photoresist; and
   (f) depositing a solder mask over the substrate between and overlapping the copper pads.

* * * * *